US009530790B1

(12) United States Patent
Lu et al.

(10) Patent No.: US 9,530,790 B1
(45) Date of Patent: Dec. 27, 2016

(54) THREE-DIMENSIONAL MEMORY DEVICE CONTAINING CMOS DEVICES OVER MEMORY STACK STRUCTURES

(71) Applicant: SANDISK TECHNOLOGIES INC., Plano, TX (US)

(72) Inventors: Zhenyu Lu, Milpitas, CA (US); Andrew Lin, San Jose, CA (US); Johann Alsmeier, San Jose, CA (US); Peter Rabkin, Cupertino, CA (US); Wei Zhao, Milpitas, CA (US); Wenguang Stephen Shi, Milpitas, CA (US); Henry Chien, San Jose, CA (US); Jian Chen, Menlo Park, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/757,572

(22) Filed: Dec. 24, 2015

(51) Int. Cl.
 *H01L 29/78* (2006.01)
 *H01L 27/115* (2006.01)
 (Continued)

(52) U.S. Cl.
 CPC ......... *H01L 27/11582* (2013.01); *G11C 16/08* (2013.01); *G11C 16/24* (2013.01); *H01L 21/02592* (2013.01); *H01L 21/02595* (2013.01); *H01L 21/02667* (2013.01); *H01L 21/28273* (2013.01); *H01L 21/28282* (2013.01); *H01L 21/768* (2013.01); *H01L 23/528* (2013.01); *H01L 23/5226* (2013.01); *H01L 27/1157* (2013.01); *H01L 27/11524* (2013.01); *H01L 27/11526* (2013.01); *H01L 27/11556* (2013.01); *H01L 27/11573* (2013.01);
 (Continued)

(58) Field of Classification Search
 CPC .... H01L 29/66; H01L 29/66757; H01L 29/78; H01L 29/78621; H01L 29/78675; H01L 27/12; H01L 27/1214
 USPC .......................................................... 257/66
 See application file for complete search history.

(56) References Cited

U.S. PATENT DOCUMENTS 5,915,167 A 6/1999 Leedy
6,881,994 B2 4/2005 Lee et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Monica D Harrison
(74) *Attorney, Agent, or Firm* — The Marbury Law Group PLLC

(57) ABSTRACT

Peripheral devices for a three-dimensional memory device can be formed over an array of memory stack structures to increase areal efficiency of a semiconductor chip. First contact via structures and first metal lines are formed over an array of memory stack structures and an alternating stack of insulating layers and electrically conductive layers. A semiconductor material layer including a single crystalline semiconductor material or a polycrystalline semiconductor material is formed over first metal lines. After formation of semiconductor devices on or in the semiconductor material layer, metal interconnect structures including second metal lines and additional conductive via structures are formed to electrically connect nodes of the semiconductor devices to respective first metal lines and to memory devices underneath.

28 Claims, 22 Drawing Sheets

(51) Int. Cl.
*H01L 23/528* (2006.01)
*H01L 29/08* (2006.01)
*H01L 29/417* (2006.01)
*G11C 16/24* (2006.01)
*G11C 16/08* (2006.01)
*H01L 23/522* (2006.01)
*H01L 29/04* (2006.01)
*H01L 29/786* (2006.01)
*H01L 29/788* (2006.01)
*H01L 21/768* (2006.01)
*H01L 21/02* (2006.01)
*H01L 21/28* (2006.01)

(52) U.S. Cl.
CPC .......... *H01L 29/04* (2013.01); *H01L 29/0847* (2013.01); *H01L 29/4175* (2013.01); *H01L 29/7883* (2013.01); *H01L 29/78672* (2013.01)

(56) References Cited

U.S. PATENT DOCUMENTS 7,746,680 B2 6/2010 Scheuerlein et al.
8,107,270 B2 1/2012 Scheuerlein et al.

OTHER PUBLICATIONS

U.S. Appl. No. 14/291,415, filed May 30, 2014, SanDisk Technologies Inc.
U.S. Appl. No. 14/517,134, filed Oct. 17, 2014, SanDisk Technologies Inc.
U.S. Appl. No. 14/739,284, filed Jun. 15, 2015, SanDisk Technologies Inc.
U.S. Appl. No. 14/739,354, filed Jun. 15, 2015, SanDisk Technologies Inc.
U.S. Appl. No. 14/832,579, filed Aug. 21, 2015, SanDisk Technologies Inc.
U.S. Appl. No. 14/862,916, filed Sep. 23, 2015, SanDisk Technologies Inc.
U.S. Appl. No. 14/925,224, filed Oct. 28, 2015, SanDisk Technologies Inc.

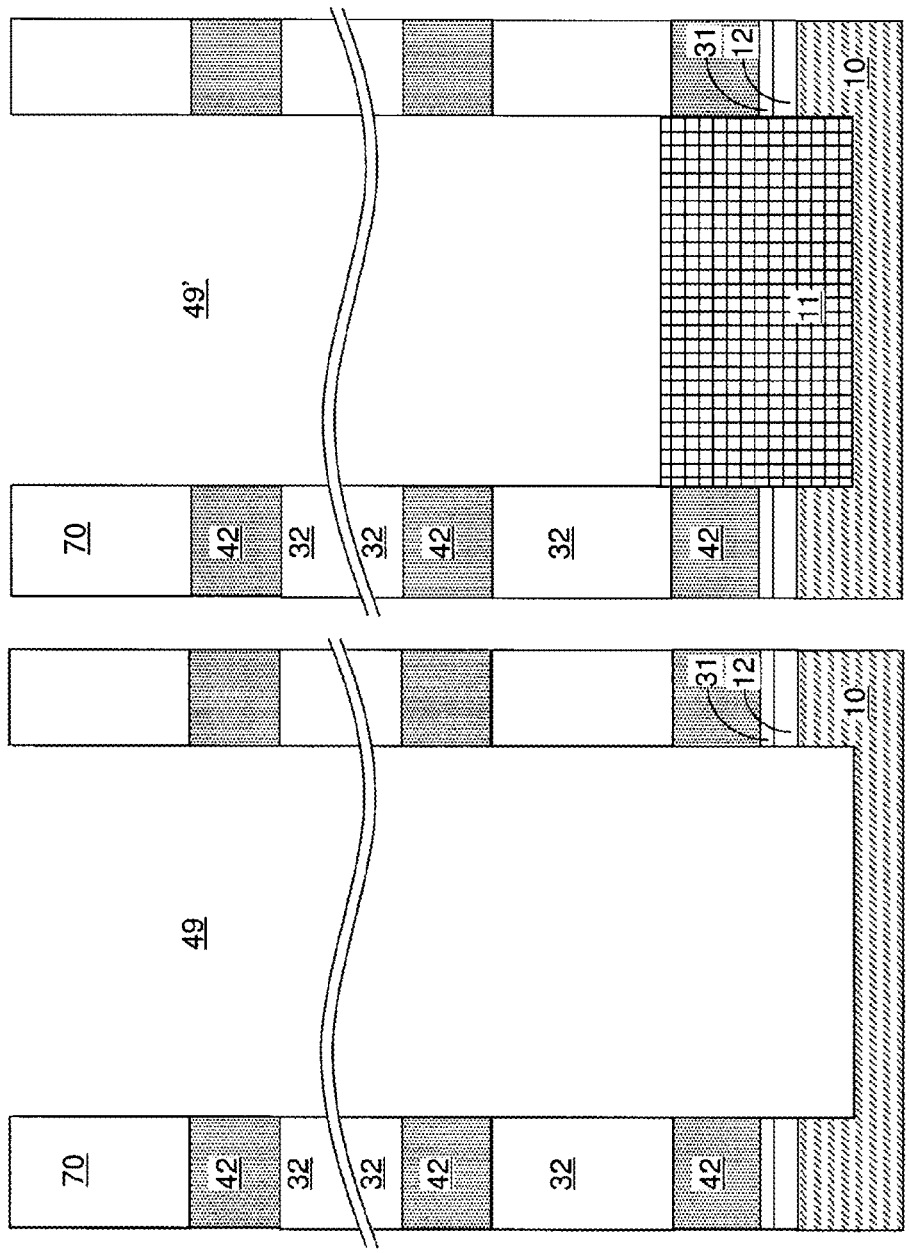

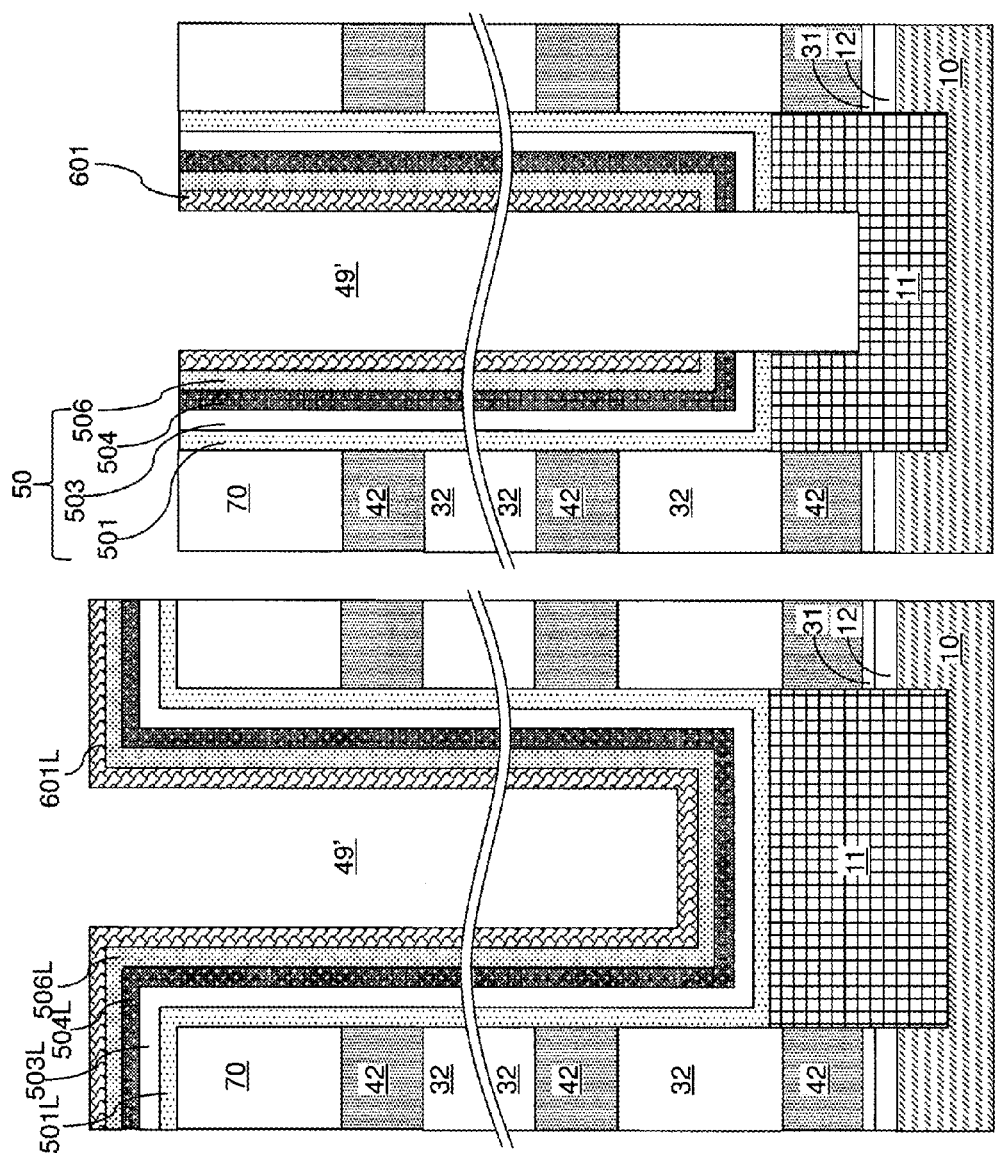

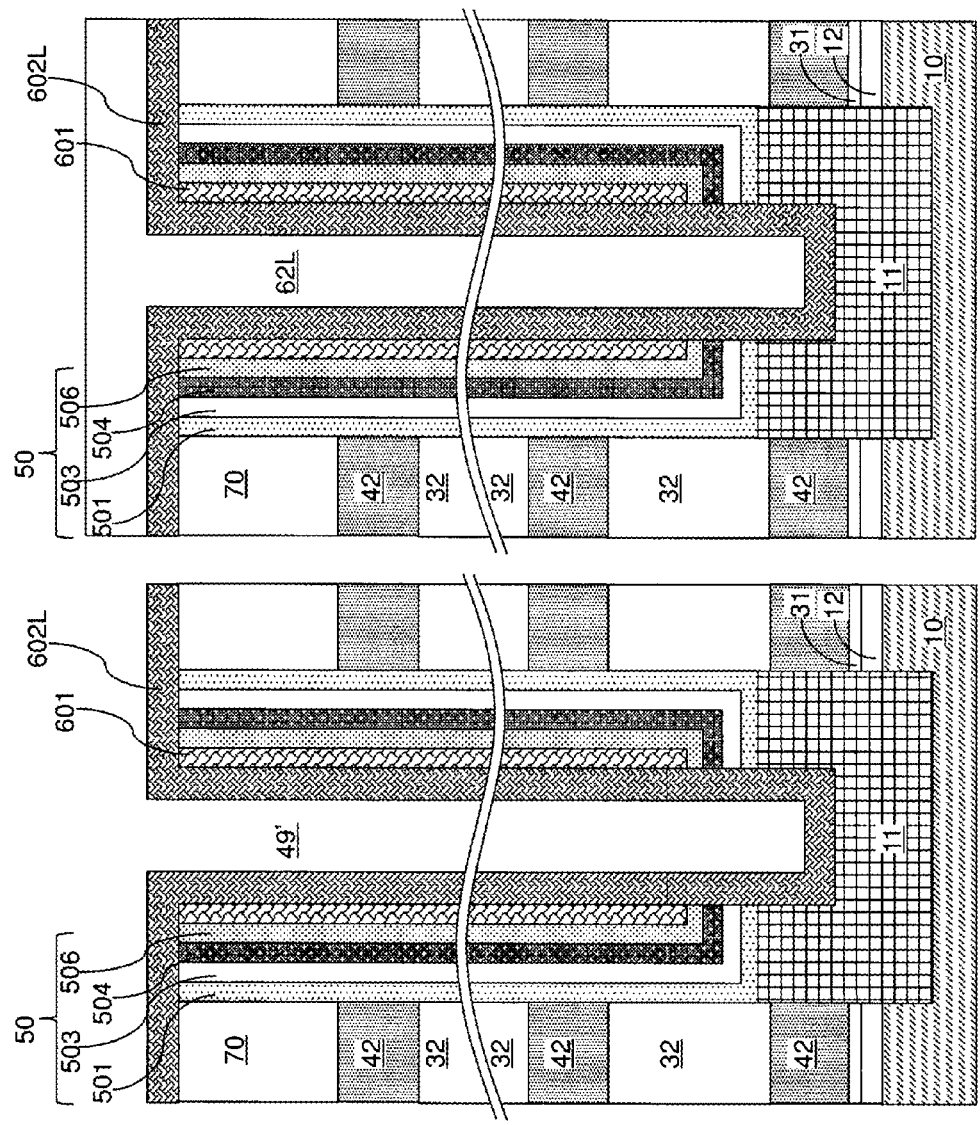

US 9,530,790 B1

THREE-DIMENSIONAL MEMORY DEVICE CONTAINING CMOS DEVICES OVER MEMORY STACK STRUCTURES

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et al., titled "Novel Ultra High Density Memory With A Stacked-Surrounding Gate Transistor (S-SGT) Structured Cell", IEDM Proc. (2001) 33-36. A three-dimensional NAND memory structure includes an alternating stack of insulating layers and electrically conductive layers.

SUMMARY

According to an aspect of the present disclosure, a three-dimensional semiconductor structure comprises an alternating stack of insulating layers and electrically conductive layers located over a substrate, an array of memory stack structures that extend through the alternating stack, each of the memory stack structures comprising a plurality of memory elements surrounding a semiconductor channel, a first metal interconnect structure overlying the alternating stack and comprising first dielectric material layers, first metal lines embedded within the first dielectric material layers, and first contact via structures contacting a bottom surface of a respective first metal line and electrically shorted to a respective element selected from nodes of the memory stack structures and the electrically conductive layers; a semiconductor material layer overlying the first metal interconnect structure, and at least one semiconductor device located on or in the semiconductor material layer and electrically connected to the first metal lines.

According to another aspect of the present disclosure, a method of forming a three-dimensional semiconductor comprises forming an alternating stack of insulating layers and spacer material layers over a substrate, forming an array of memory stack structures that extend through the alternating stack, each of the memory stack structures comprising a plurality of memory elements surrounding a semiconductor channel, wherein the spacer material layers are formed as, or are replaced with, electrically conductive layers, forming a first metal interconnect structure, wherein the first metal interconnect structure comprises first dielectric material layers overlying the alternating stack, first metal lines embedded within the first dielectric material layers, and first contact via structures contacting a bottom surface of a respective first metal line and electrically shorted to a respective element selected from nodes of the memory stack structures and the electrically conductive layers, forming a semiconductor material layer over the metal interconnect structure, forming at least one semiconductor device on or in the semiconductor material layer, and electrically connecting the at least one semiconductor device to the first metal lines.

According to another aspect of the present disclosure, a vertical NAND device comprises a substrate, a plurality of semiconductor channels, wherein at least one end portion of each of the plurality of semiconductor channels extends substantially perpendicular to a top surface of the substrate, a plurality of doped drain regions located over the respective end portion of each of the plurality of semiconductor channels, a doped source region located in or on the substrate, a plurality of charge storage regions, each charge storage region located adjacent to a respective one of the plurality of semiconductor channels, a plurality of control gate electrodes having a strip shape extending substantially parallel to the top surface of the substrate, wherein the plurality of control gate electrodes comprise at least a first control gate electrode located in a first device level and a second control gate electrode located in a second device level, a lower select gate electrode located between the substrate and the plurality of control gate electrodes, an upper select gate electrode located over a plurality of control gate electrodes, a source contact via structure located in a trench extending through the plurality of control gate electrodes, the source contact via structure contacting the source region, and driver circuit transistors located above the drain regions. In an embodiment, the driver circuit transistors may comprise TFT CMOS devices.

BRIEF DESCRIPTION OF THE DRAWINGS

FIGS. 4A-4H are sequential vertical cross-sectional views of a memory opening within the exemplary structure during various processing steps employed to form a memory stack structure according to an embodiment of the present disclosure.

FIG. 11A is a vertical cross-sectional view along a vertical cross-sectional plane A-A' in FIG. 11C. FIG. 11B is a vertical cross-sectional view along a vertical cross-sectional plane B-B' in FIG. 11C. FIG. 11C is a plan view.

FIG. 13A is a vertical cross-sectional view along a plane corresponding to the vertical plane A-A' of FIG. 11C, and FIG. 13B is a vertical cross-sectional view along a plane corresponding to the vertical plane B-B' of FIG. 11C.

FIG. 14A is a vertical cross-sectional view along a plane corresponding to the vertical plane A-A' of FIG. 11C, and FIG. 14B is a vertical cross-sectional view along a plane corresponding to the vertical plane B-B' of FIG. 11C.

DETAILED DESCRIPTION

Figure 1:
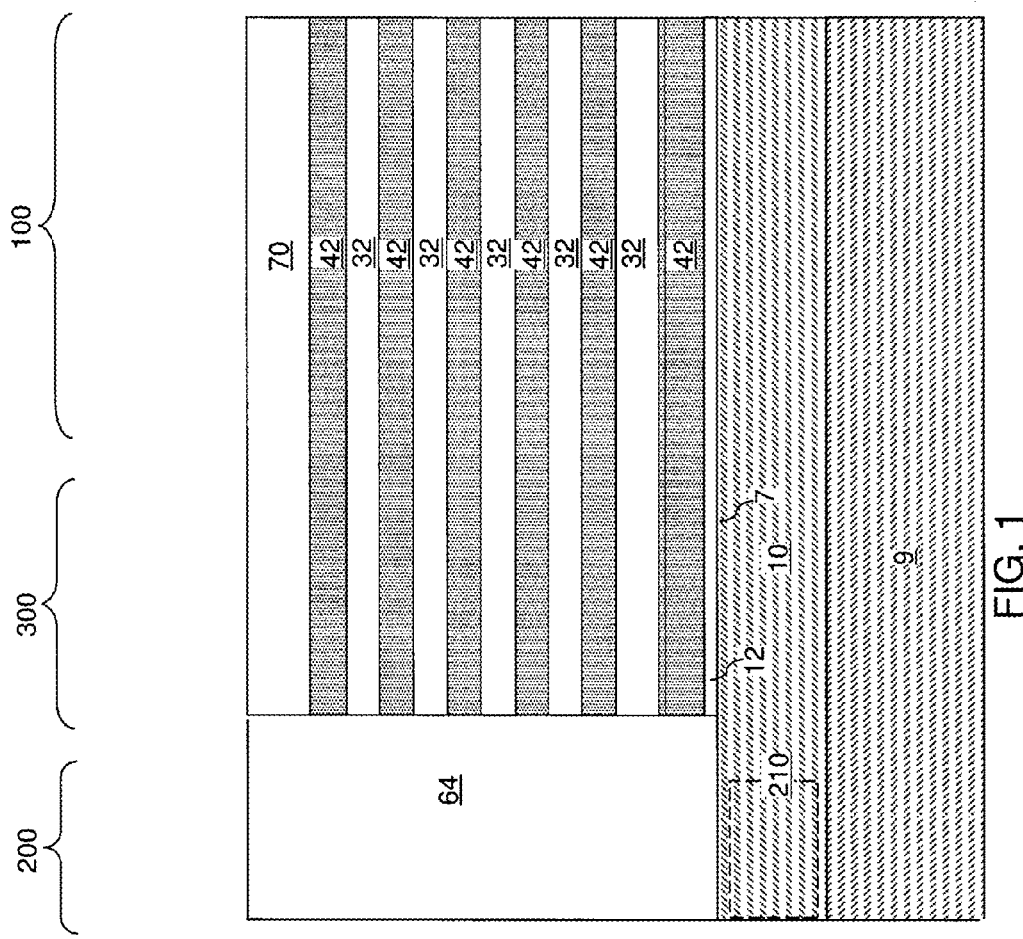
FIG. 1 is a vertical cross-sectional view of an exemplary structure after formation of an alternating stack of insulating layers and spacer material layers and a dielectric material portion according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. Disclosure of an embodiment in which a first element comprises a second element herein also discloses another embodiment in which the first element consists essentially of, or consists of, the second element except for cases in which presence of an additional element is inherently implied.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which may include a semiconductor substrate (e.g., a single crystalline silicon wafer). The substrate can include a substrate semiconductor layer 9 including a top surface 7, which is herein referred to as a major surface of the substrate (as opposed to a minor surface having a lesser area such as a sidewall surface of the substrate semiconductor layer 9). An optional semiconductor well layer 10 may be located over the substrate semiconductor layer 9, and can include at least one elemental semiconductor material (e.g., silicon, such as single crystalline silicon), at least one compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. All measurements for electrical conductivities are made at the standard condition. The semiconductor well layer 10 can include at least one doped well (not expressly shown) having a substantially uniform dopant concentration therein.

The exemplary structure can have multiple regions for building different types of devices. Such areas can include, for example, a device region 100, a contact region 300, and an optional peripheral device region 200. At least one semiconductor device for a peripheral circuitry can be formed on a portion of the substrate semiconductor layer 9. The at least one semiconductor device can include, for example, field effect transistors that are formed in the peripheral device region 200. Optionally, a portion of the substrate semiconductor layer 9 in the peripheral device region may be recessed by a masked recess etch, or may be raised by a selective epitaxy process that employs a dielectric hard mask that covers other regions, prior to formation of the at least one semiconductor device therein.

An optional semiconductor well layer 10 can be formed on the top surface of the substrate semiconductor layer 9 by deposition of a single crystalline semiconductor material, for example, by selective epitaxy. Alternatively, the optional semiconductor well layer 10 may be formed by implantation of electrical dopants (p-type dopants or n-type dopants) into at least one upper portion of the substrate semiconductor layer 9. In case the optional semiconductor well layer 10 is not formed, the substrate semiconductor layer 9 can extend to the top surface of the substrate. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor well layer 10 can be in epitaxial alignment with the single crystalline structure of the substrate semiconductor layer 9.

In one embodiment, the semiconductor well layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor well layer 10 or can be a portion of the semiconductor well layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

At least one semiconductor device 210 may be optionally formed in the peripheral device region 200. The at least one semiconductor device 210 can include any semiconductor device that can be employed for operation of the memory cells to be subsequently formed in the device region 100, and may include a driver circuit for a vertical memory device to be formed in the device region 100. Alternatively, the device 210 is omitted and the entire driver circuit is formed in the device region 100 over the NAND string array as will be described in more detail below. Optionally, a gate dielectric layer 12 can be formed above the semiconductor well layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a spacer material layer, which is a material layer that provides vertical spacing between a neighboring pair of insulating layers 32. In one embodiment, each first material layer can be an insulating layer 32, and each second material layer can be a sacrificial material layer 42. In other words, the spacer material layers may be sacrificial material layers 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein. Alternatively, the spacer material layers may be formed as electrically conductive layers. In this case, replacement of the spacer material layers with different electrically conductive layers in a subsequent processing step may not be necessary.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, silicon oxynitride, and a dielectric metal oxide.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Optionally, a portion of the alternating stack (32, 42) can be removed from the peripheral device region 200, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200. Subsequently, the trench can be filled with an optional dielectric material such as silicon oxide. Excess portions of the dielectric material can be removed from above the top surface of the insulating cap layer 70 by a planarization process such as chemical mechanical planarization and/or a recess etch. The top surfaces of the insulating cap layer 70 can be employed as a stopping surface during the planarization. The remaining dielectric material in the trench constitutes an optional dielectric material portion 64.

Figure 2:
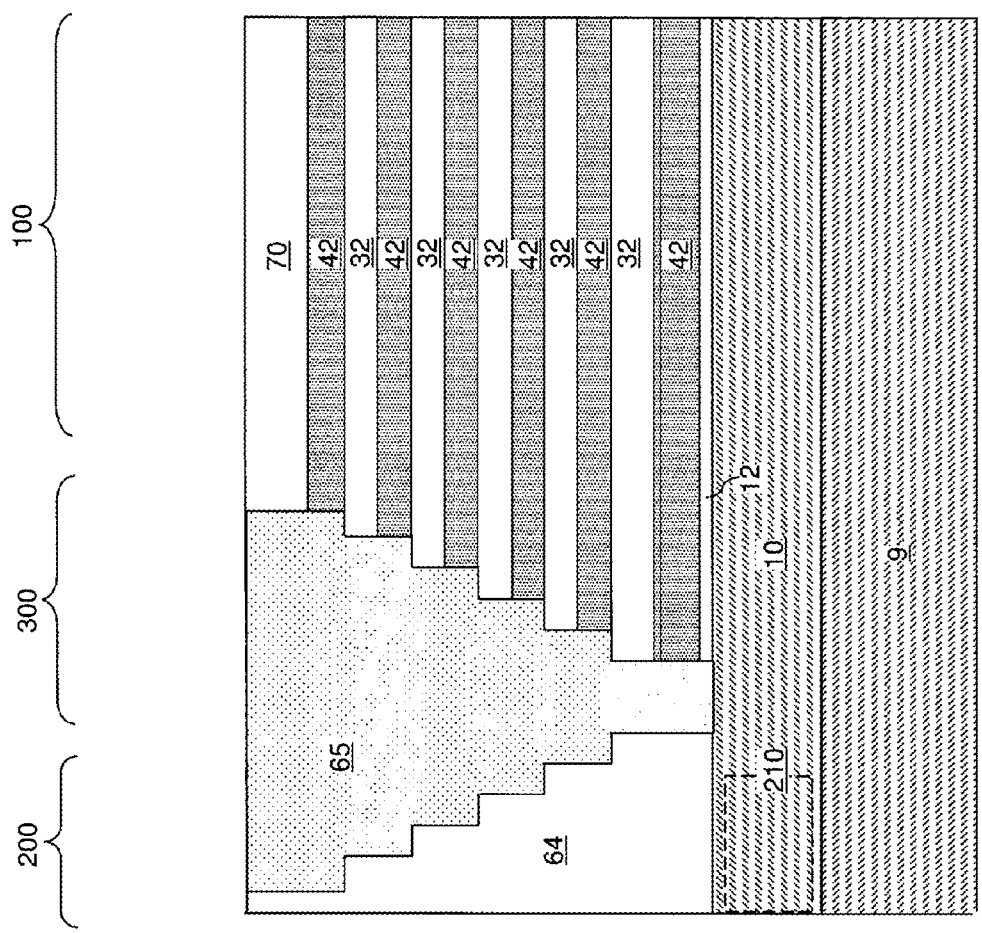
FIG. 2 is a vertical cross-sectional view of the exemplary structure after formation of a retro-stepped dielectric material portion according to an embodiment of the present disclosure.

Referring to FIG. 2, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor well layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the contact level dielectric layer 71, for example, by chemical mechanical planarization (CMP). The remaining portion of the deposited dielectric material filling the stepped cavity in the contact region 300 and overlying the semiconductor well layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the contact level dielectric layer 71. In an alternative embodiment, the dielectric material portion 64 is omitted, and its space is occupied by the retro-stepped dielectric material portion 65 or by a dummy stack of stepped layers (32, 42).

Figure 3:
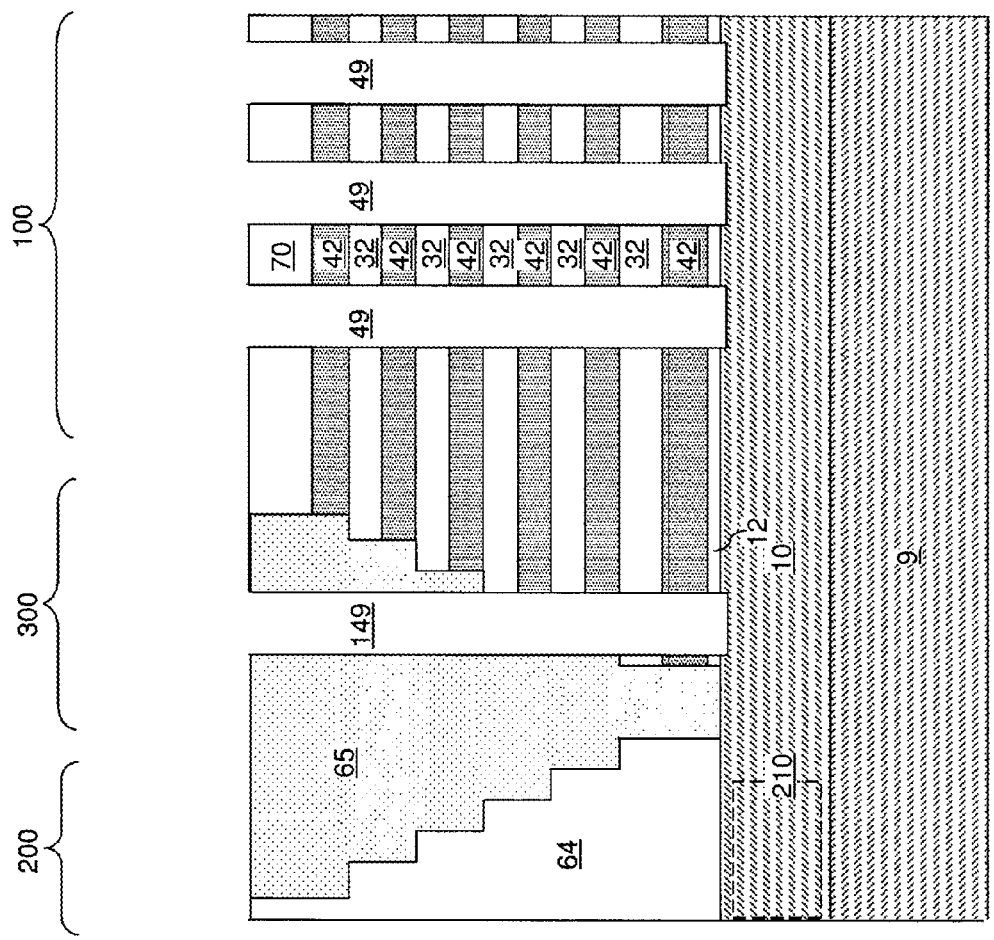
FIG. 3 is a vertical cross-sectional view of the exemplary structure after formation of memory openings and dummy openings according to an embodiment of the present disclosure.

Referring to FIG. 3, a lithographic material stack (not shown) including at least a photoresist layer can be formed over the insulating cap layer 70 and the alternating stack (32, 42), and can be lithographically patterned to form openings in the device region 100 and the contact region. The pattern in the lithographic material stack can be transferred through the insulating cap layer 70 and through entirety of the alternating stack (32, 42) and/or the retro-stepped dielectric material portion 65 by at least one anisotropic etch that employs the patterned lithographic material stack as an etch mask. Portions of the alternating stack (32, 42) underlying the openings in the patterned lithographic material stack within the device region 100 are etched to form memory openings 49. Portions of the retro-stepped dielectric material portion 65 and the alternating stack (32, 42) underlying the openings in the patterned lithographic material stack within the contact region 300 are etched to form dummy openings 149. In other words, the transfer of the pattern in the patterned lithographic material stack through the alternating stack (32, 42) and the retro-stepped dielectric material portion 65 forms the memory openings 49 and the dummy openings 149. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the memory openings can be substantially vertical, or can be tapered. The patterned lithographic material stack can be subsequently removed, for example, by ashing. Alternatively, the order of steps of forming the memory openings 49 and the retro-stepped dielectric material portion 65 may be reversed, such that the memory openings 49 are formed and/or filled with memory stack structures prior to forming the steps and the retro-stepped dielectric material portion 65.

A memory stack structure can be formed in each of the memory opening 49. A support pillar structure can be formed in each of the dummy openings 149 concurrently with formation of the memory stack structures. Alternatively, the dummy openings 149 may be formed separately from the memory openings 49 and filled with insulating (e.g., silicon oxide) support pillars prior to removing layers 42 from the alternating stack. FIGS. 4A-4H illustrate sequential vertical cross-sectional views of a memory opening during formation of an exemplary memory stack structure. Each support pillar structure that is formed in a dummy opening 149 can have the same structures as the exemplary memory stack structure with possible differences in lateral dimensions of components therein. A memory stack structure can be formed within each of the memory openings 49, and a support pillar structure can be formed within each of the dummy openings 149. Each support pillar structure can have the same set of components as a memory stack structure.

Referring to FIG. 4A, a memory opening 49 is illustrated. The memory opening 49 extends through the insulating cap layer 70, the alternating stack (32, 42), and the gate dielectric layer 12, and optionally into an upper portion of the semiconductor well layer 10. The recess depth of the bottom surface of each memory opening 49 with respect to the top surface of the semiconductor well layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 4B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor well layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor well layer 10. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Referring to FIG. 4C, a series of layers including at least one blocking dielectric layer (501L, 503L), a continuous memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

In an illustrative example, the first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

The continuous memory material layer 504L, the tunneling dielectric layer 506L, and the optional first semiconductor channel layer 601L can be sequentially formed. In one embodiment, the continuous memory material layer 504L can be a charge trapping material including a dielectric charge trapping material, which can be, for example, silicon nitride. Alternatively, the continuous memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504L includes a silicon nitride layer.

The continuous memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504L may comprise an insulating charge trapping material, such as one or more silicon nitride segments. Alternatively, the continuous memory material layer 504L may comprise conductive nanoparticles such as metal nanoparticles, which can be, for example, ruthenium nanoparticles. The continuous memory material layer 504L can be formed, for example, by chemical vapor deposition (CVD), atomic layer deposition (ALD), physical vapor deposition (PVD), or any suitable deposition technique for storing electrical charges therein. The thickness of the continuous memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506L, 601L).

Referring to FIG. 4D, the optional first semiconductor channel layer 601L, the tunneling dielectric layer 506L, the continuous memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the continuous memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the continuous memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the continuous memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the continuous memory material layer 504L is herein referred to as a memory material layer 504. The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. Each remaining portion of the second blocking dielectric layer 503L is herein referred to as a second blocking dielectric 503. Each remaining portion of the first blocking dielectric layer 501L is herein referred to as a first blocking dielectric 501.

A surface of the epitaxial channel portion 11 (or a surface of the semiconductor well layer 10 in case the epitaxial channel portions 11 are not employed) can be physically exposed underneath the opening through the first semiconductor channel portion 601, the tunneling dielectric 506, the memory material layer 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor well layer 10 in case epitaxial channel portions 11 are not employed) by a recess distance. A tunneling dielectric 506 is located over the memory material layer 504. A set of at least one blocking dielectric (501, 503), a memory material layer 504, and a tunneling dielectric 506 in a memory opening 49 constitutes a memory film 50, which includes a plurality of charge storage regions (as embodied as the memory material layer 504) that are insulated from surrounding materials by the at least one blocking dielectric (501, 503) and the tunneling dielectric 506.

In one embodiment, the first semiconductor channel portion 601, the tunneling dielectric 506, the memory material layer 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 4E, a second semiconductor channel layer 602L can be deposited directly on the semiconductor surface of the epitaxial channel portion 11 or the semiconductor well layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 4F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 4G:
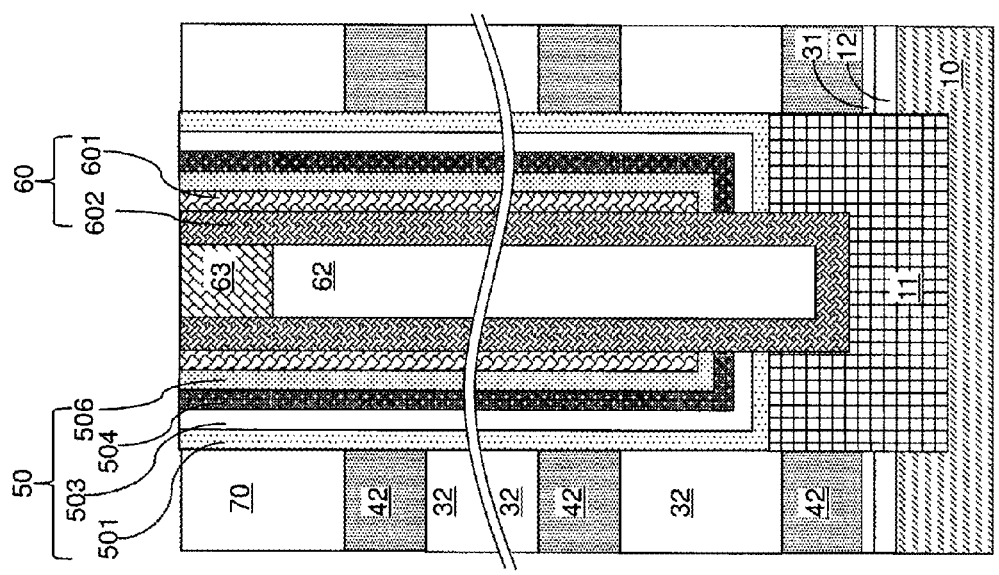

Referring to FIG. 4G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is surrounded by a memory material layer 504, and laterally surrounds a portion of the semiconductor channel 60. Each adjoining set of a first blocking dielectric 501, a second blocking dielectric 503, a memory material layer 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

Figure 4H:
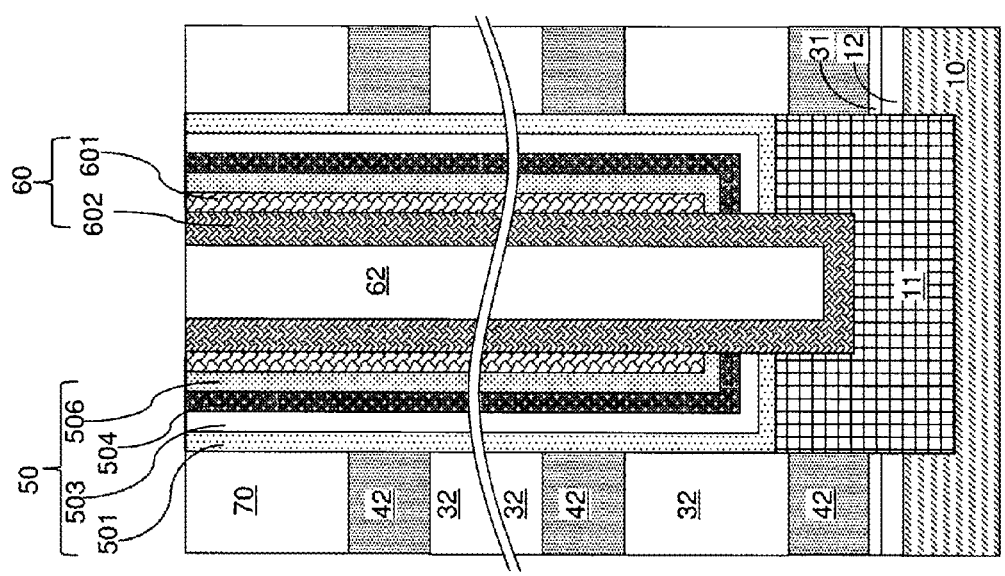

Referring to FIG. 4H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Instances of the exemplary memory stack structure 55 can be formed in the memory openings 49 of the exemplary structure illustrated in FIG. 3. Instances of a support pillar structure 155, which can have the same set of structural components as a memory stack structure 55, can be formed in the dummy openings 149 of the exemplary structure illustrated in FIG. 3. The difference between a memory stack structure 55 and a support pillar structure 155 is that a drain region 63 overlying a memory stack structure 55 is electrically contacted by a bit line, while a drain region 63 overlying a support pillar structure 155 is not electrically contacted by any bit line.

Figure 5:
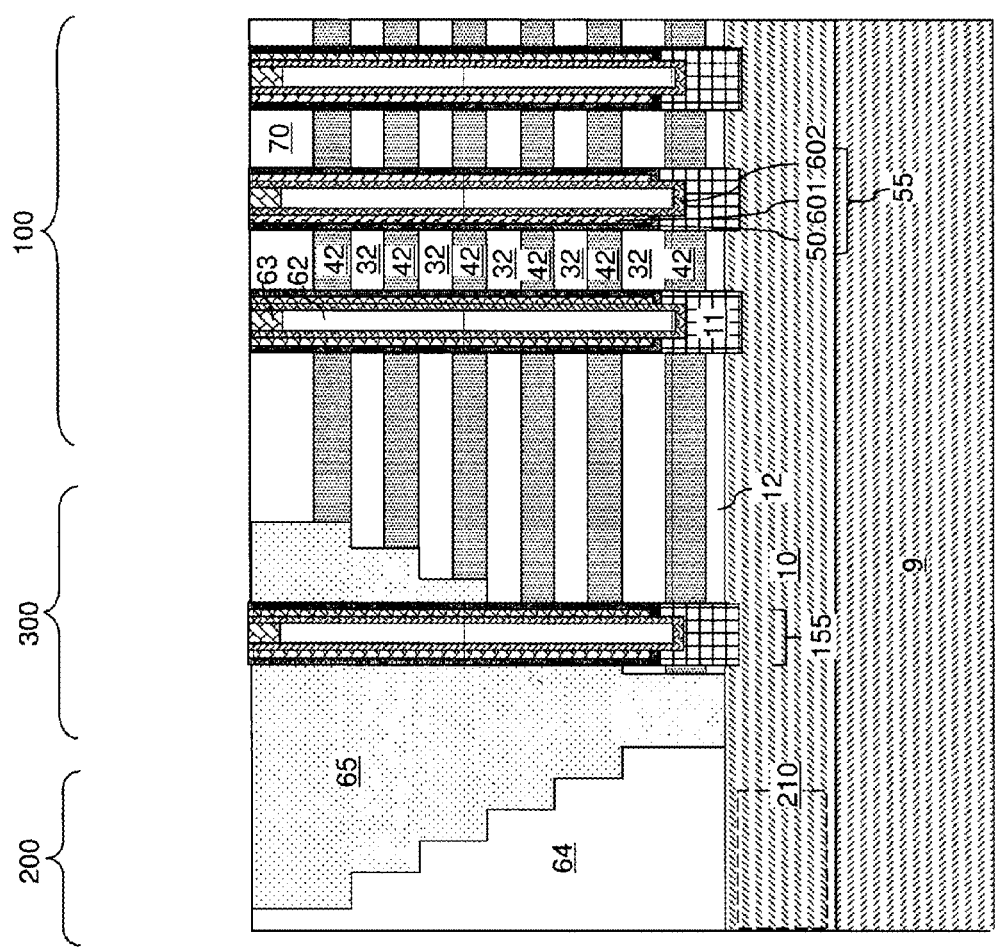
FIG. 5 is a vertical cross-sectional view of the exemplary structure after formation of memory stack structures according to an embodiment of the present disclosure.

FIG. 5 illustrates the exemplary structure that incorporates multiple instances of the exemplary memory stack structure of FIG. 4H. Each exemplary memory stack structure 55 or each support pillar structure 155 includes a semiconductor channel 60 (comprising layers 601, 602); a tunneling dielectric layer 506 laterally surrounding the semiconductor channel 60; and a vertical stack of charge storage regions laterally surrounding the tunneling dielectric layer 506 (as embodied as a memory material layer 504). The exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor well layer 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures.

Figure 6A:
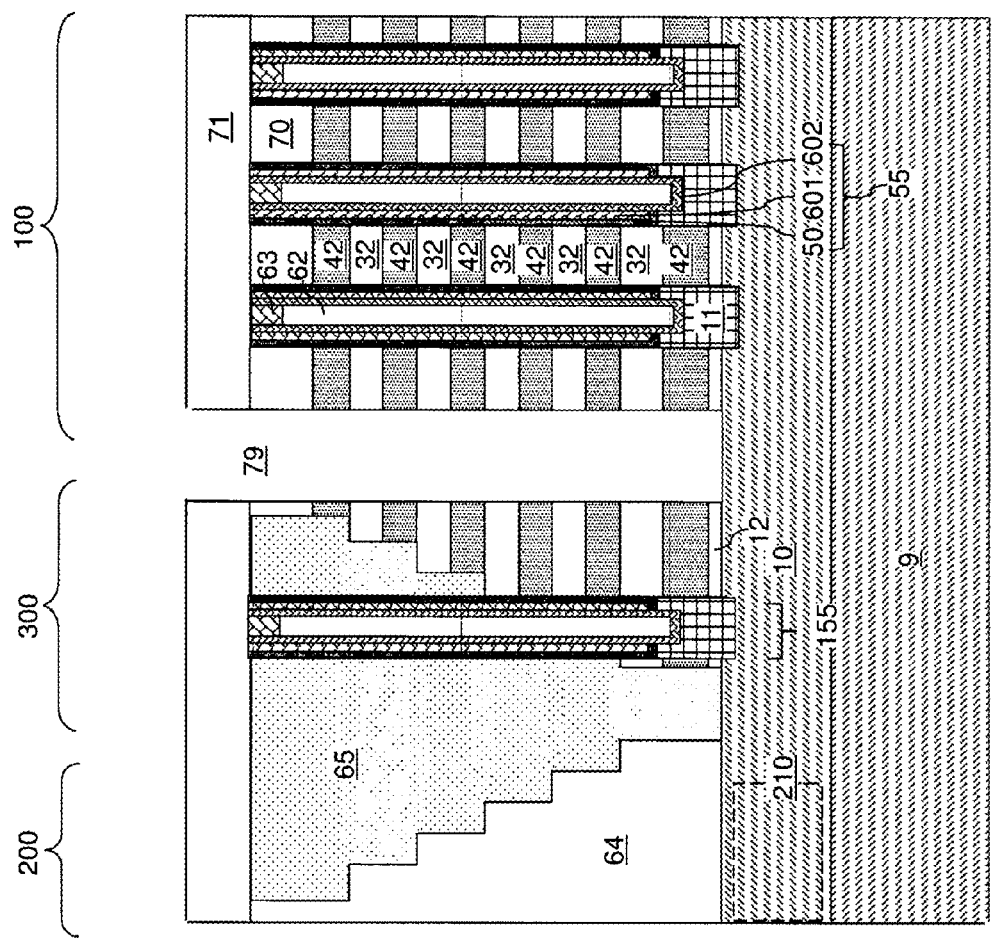
FIG. 6A is a vertical cross-sectional view of the exemplary structure after formation of backside trenches according to an embodiment of the present disclosure.
Figure 6B:
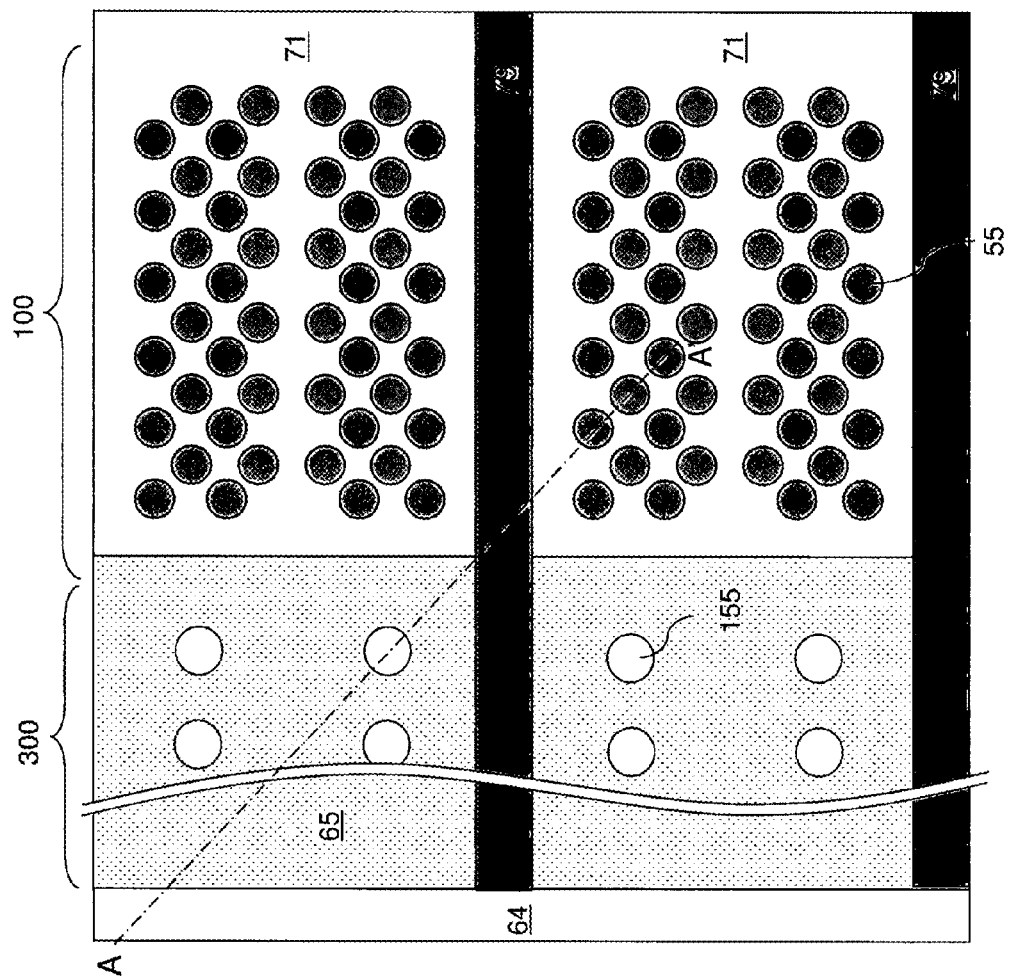
FIG. 6B is a plan view of the exemplary structure of FIG. 6A.

Referring to FIGS. 6A and 6B, an optional contact level dielectric layer 71 can be formed over the semiconductor well layer 10. As an optional structure, the contact level dielectric layer 71 may, or may not, be formed. In case the contact level dielectric layer 71 is formed, the contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The contact level dielectric layer 71 can be formed over a horizontal plane including the top surface of the insulating cap layer 70 and the top surfaces of the drain regions 63. The contact level dielectric layer 71 can be deposited by chemical vapor deposition, atomic layer deposition (ALD), spin-coating, or a combination thereof. The thickness of the contact level dielectric layer 71 can be in a range from 10 nm to 300 nm, although lesser and greater thicknesses can also be.

Trenches (which are herein referred to as backside trenches 79) can be formed between each neighboring pair of clusters of the memory stack structures 55 by transferring the pattern of the openings in the photoresist layer through the contact level dielectric layer 71, the retro-stepped dielectric material portion 65, and the alternating stack (32, 42). Each backside trench 79 extends through the in-process alternating stack (32, 42) and to the top surface of the substrate (9, 10). A top surface of the semiconductor well layer 10 can be physically exposed at the bottom of each backside trench 79. In one embodiment, each backside trench 79 can extend along a first horizontal direction so that clusters of the memory stack structures 55 are laterally spaced along a second horizontal direction that is different from the first horizontal direction. Each cluster of memory stack structures 55 in conjunction with the portions of the alternating stack (32, 42) that surround the cluster constitutes a memory block. Each memory block is laterally spaced from one another by the backside trenches 79.

The alternating stack of insulating layers 32 and the sacrificial material layers 42 is an in-process structure, i.e., an in-process alternating stack. The in-process alternating stack is subsequently modified by replacement of the sacrificial material layers 42 with electrically conductive layers.

Figure 7:
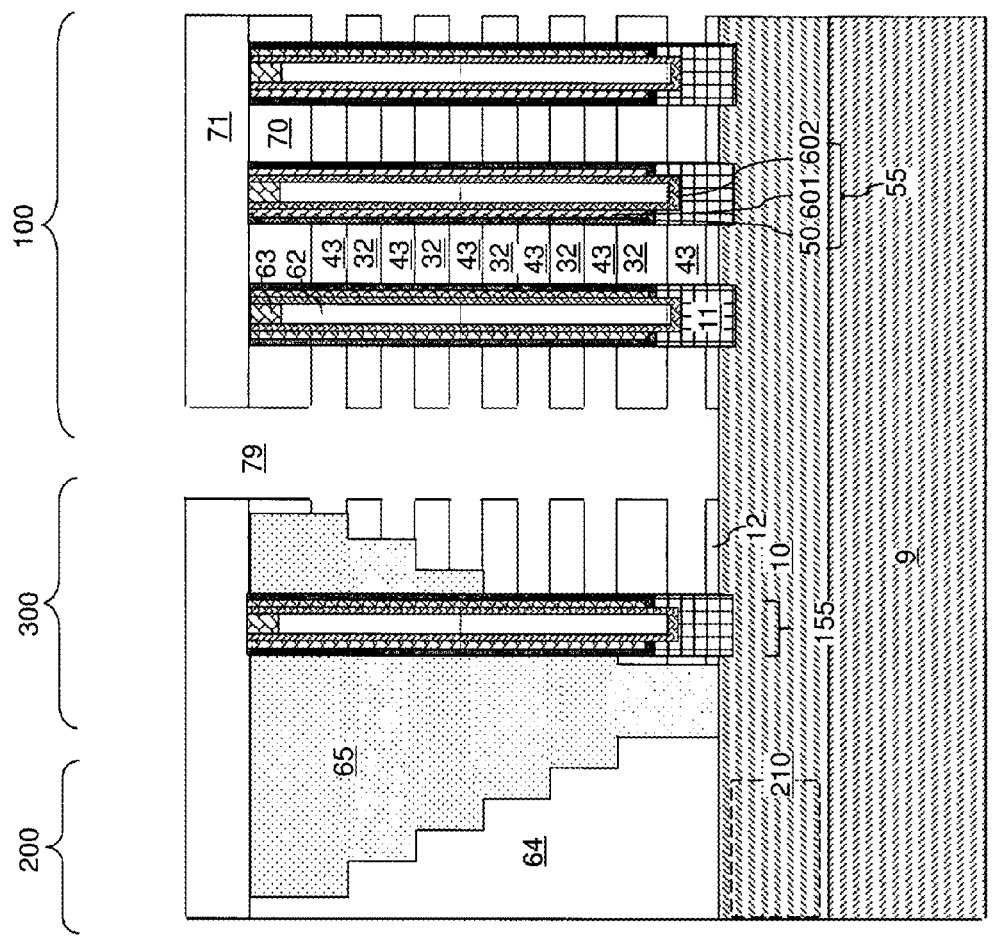
FIG. 7 is a vertical cross-sectional view of the exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced through the backside trenches 79, for example, employing an etch process. Recesses (which are herein referred to as backside recesses 43) are formed in volumes from which the sacrificial material layers 42 are removed. The backside trenches 79 and the backside recesses 43 are formed from locations away from the memory stack structures 55, which are formed within memory openings 49 that are also referred to as front side openings.

The removal of the second material of the sacrificial material layers 42 can be selective to the first material of the insulating layers 32, the material of the sidewalls of the support pillar structures 155, the material of the retro-stepped dielectric material portion 65, the semiconductor material of the semiconductor well layer 10, and the material of the outermost layer of the memory films 50. In one embodiment, the sacrificial material layers 42 can include silicon nitride, and the materials of the insulating layers 32, the sidewalls of the support pillar structures 155, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the support pillar structures 155, and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor well layer 10.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 155, the retro-stepped dielectric material portion 65, and the memory stack structures 55 provide structural support while the backside recesses 43 are present within volumes previously occupied by the sacrificial material layers 12.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or holes in contrast with the backside recesses 43. In one embodiment, the device region 100 comprises an array of monolithic three-dimensional NAND strings having a plurality of device levels disposed above the substrate (e.g., above the semiconductor well layer 10). In this case, each backside recess 43 can define a space for receiving a respective word line of the array of monolithic three-dimensional NAND strings.

Each of the plurality of backside recesses 43 can extend substantially parallel to the top surface of the semiconductor well layer 10. A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Figure 8:
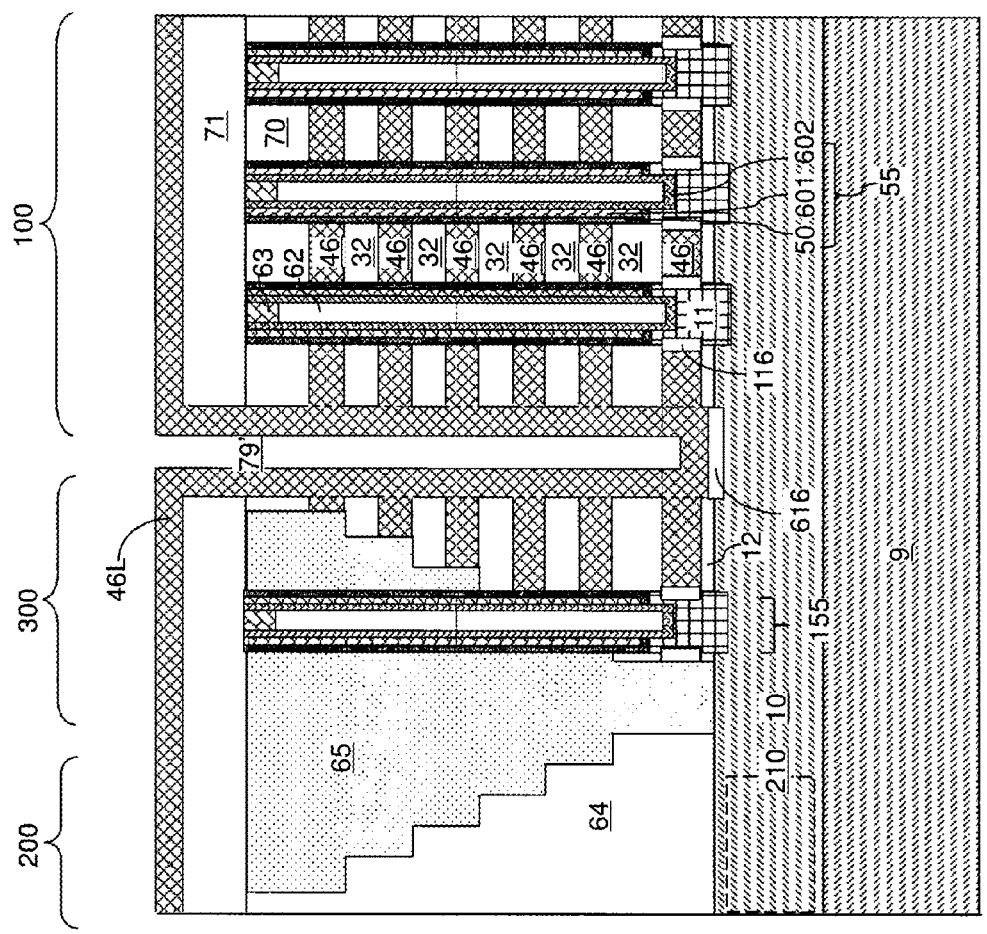
FIG. 8 is a vertical cross-sectional view of the exemplary structure after formation of electrically conductive layers according to an embodiment of the present disclosure.

Referring to FIG. 8, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

A backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each memory stack structure 55, the backside blocking dielectric layer is optional. In case a blocking dielectric is not present in the memory stack structures 55, the backside blocking dielectric layer is present.

At least one metallic material can be deposited in the plurality of backside recesses 43, on the sidewalls of the at least one the backside contact trench 79, and over the top surface of the contact level dielectric layer 71. As used herein, a metallic material refers to an electrically conductive material that includes at least one metallic element The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process.

A plurality of electrically conductive layers 46 can be formed in the plurality of backside recesses 43, and a continuous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L.

Figure 9:
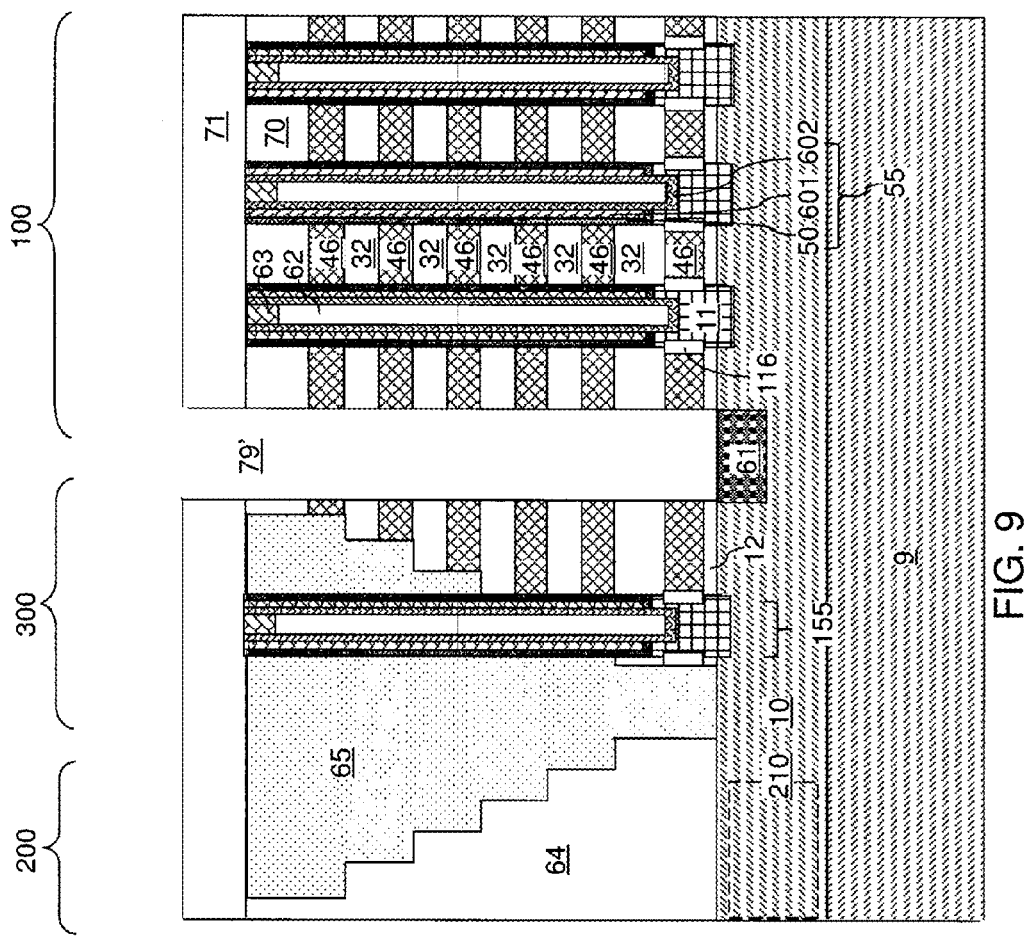
FIG. 9 is a vertical cross-sectional view of the exemplary structure after removal of a deposited conductive material from within the backside contact trench according to an embodiment of the present disclosure.

Referring to FIG. 9, the deposited metallic material of the continuous metallic material layer 46L is etched back from the sidewalls of each backside contact trench 79 and from above the contact level dielectric layer 71, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch. Each backside trench 79 extends through the alternating stack (32, 46) of the insulating layers 32 and the electrically conductive layers 46 and to the top surface of the substrate (9, 10).

In one embodiment, source regions 61 can be formed in, or on, portions of the semiconductor well layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

Figure 10:
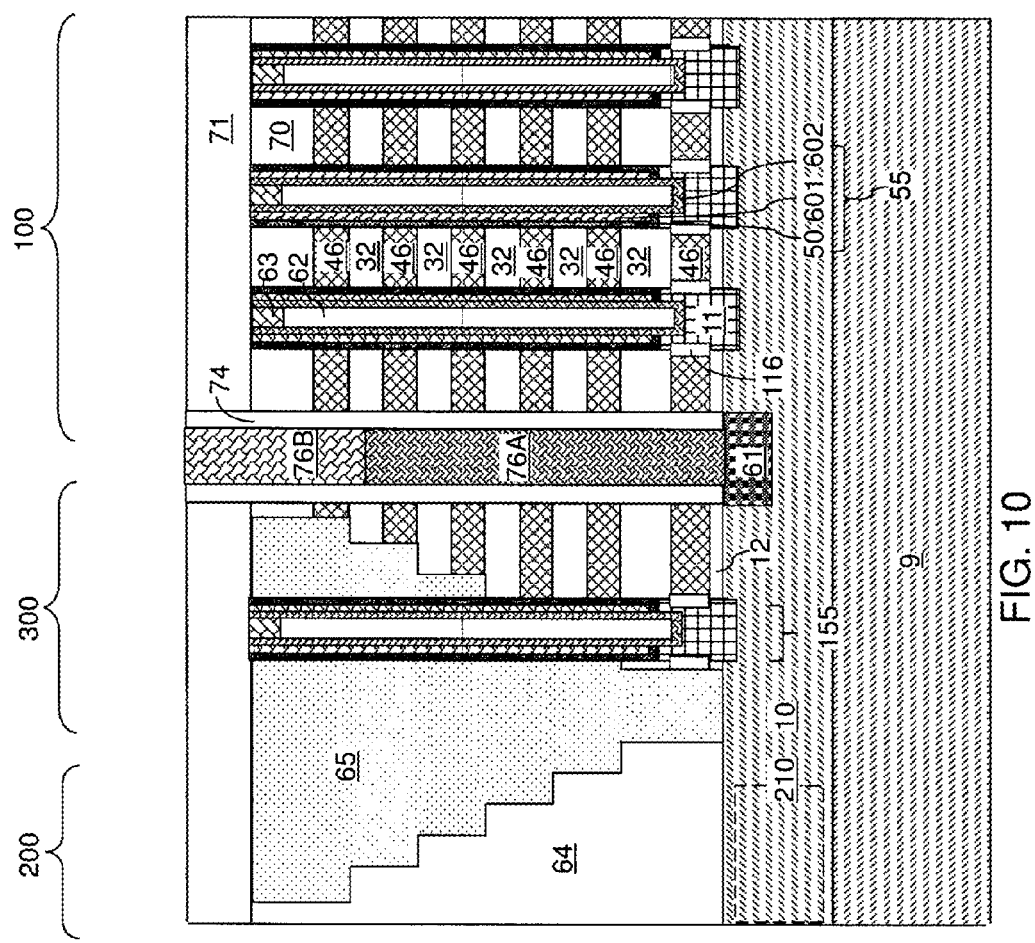
FIG. 10 is a vertical cross-sectional view of the exemplary structure along a plane corresponding to the vertical plane X-X' of FIG. 11C after formation of an insulating spacer and source contact via structures according to an embodiment of the present disclosure.
Figure 11A:
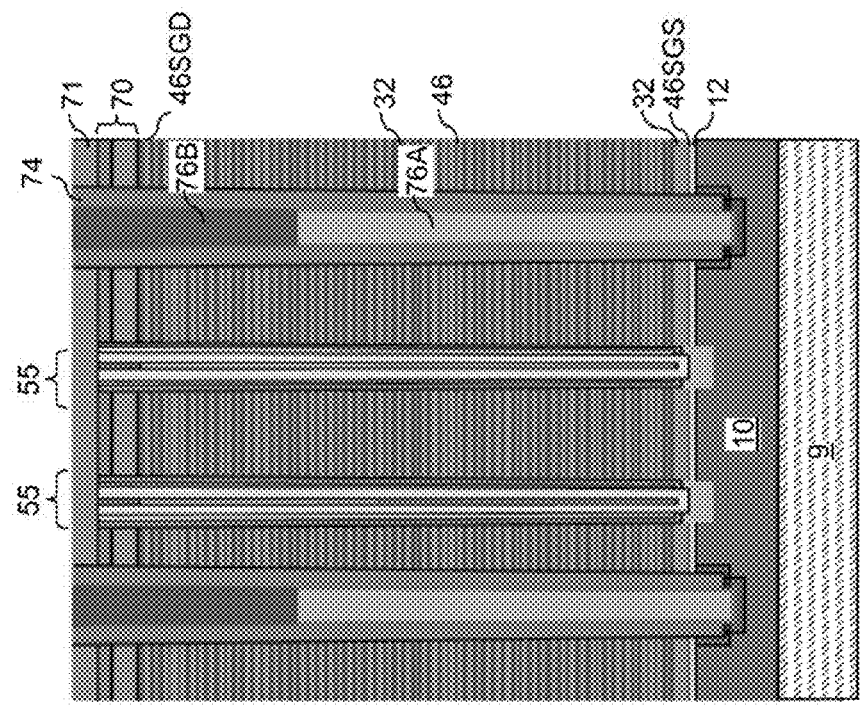
FIGS. 11A-11C illustrate the exemplary structure of FIG. 10 for an embodiment employing different numbers of layers in the alternating stack.
Figure 11B:
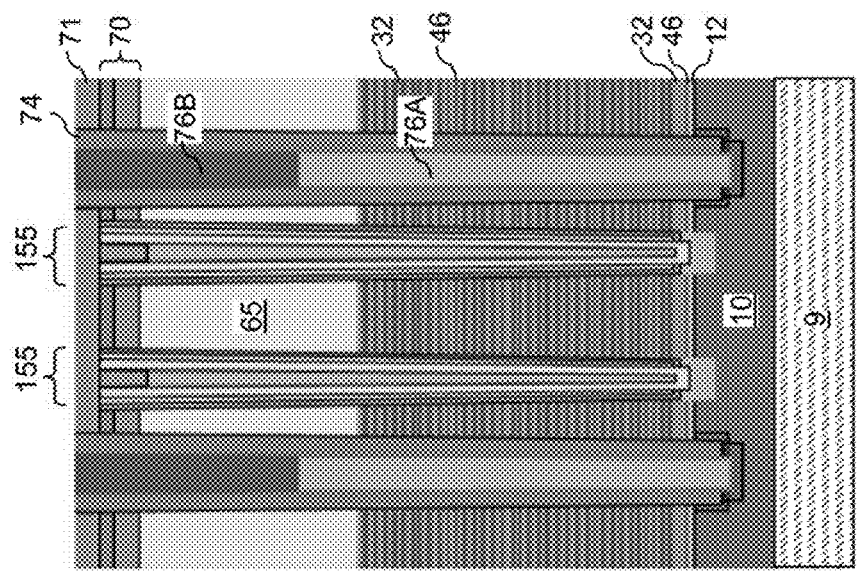

Referring to FIGS. 10, 11A, 11B, and 11C, an insulating material layer can be formed in each backside contact trench 79 and over the contact level dielectric layer 71 by a conformal deposition process. FIG. 10 illustrates a structure derived from the exemplary structure of FIG. 9, and FIGS. 11A and 11B illustrate an alternate structure having different numbers of layers in the alternating stack (32, 46). The vertical plane X-X' in FIG. 11C corresponds the plane of the vertical cross-sectional view of FIG. 10. The vertical plane A-A' in FIG. 11C corresponds to the plane of the vertical cross-sectional view of FIG. 11A. The vertical cross-sectional plane B-B' in FIG. 11C corresponds to the plane of the vertical cross-sectional view of FIG. 11B.

Exemplary conformal deposition processes that can be employed to form the insulating material layer include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the contact level dielectric layer 71. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. Each insulating spacer 74 laterally surrounds a cavity, which is herein referred to as a backside cavity 79'. A top surface of a source region 61 (which is a doped semiconductor material portion) can be physically exposed at the bottom of each backside cavity 79' that is provided within an insulating spacer 74.

A source contact via structure (76A, 76B) can be formed in each of the backside trenches 79 by deposition of at least one conductive material. Excess portions of the at least one conductive material can be removed from above the top surface of the contact level dielectric layer 71 by a planarization process (such as a chemical mechanical planarization process). In one embodiment, each contact via structure (76A, 76B) can include a lower contact via structure 76A including a first conductive material (such as doped polysilicon) and an upper contact via structure 76B including a second conductive material (such as a combination of a TiN liner and tungsten fill material).

As shown in FIG. 11B, a lower select gate electrode 46SGS (e.g., source side select gate electrode) may be located between the substrate (9, 10) and the plurality of control gate electrodes 46. An upper select gate electrode 46SGD may be located over a plurality of control gate electrodes 46. Thus, one or more of the lower layers 46 may function as source side select gate electrodes 46SGS of source side select transistors of the NAND device, while one or more of the upper layers 46 may function as drain side select gate electrodes 46SGD of drain side select transistors of the NAND device.

Figure 11C:
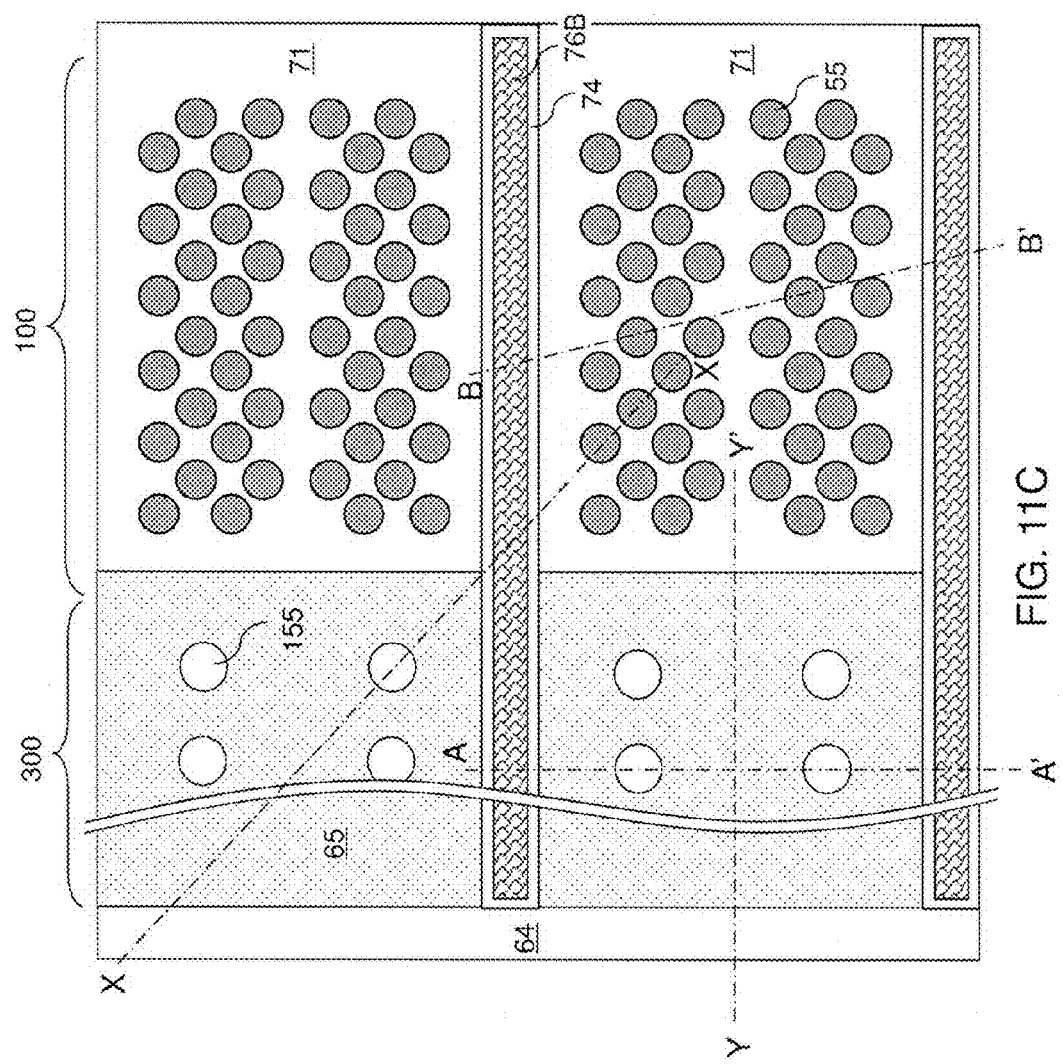
Figure 12:
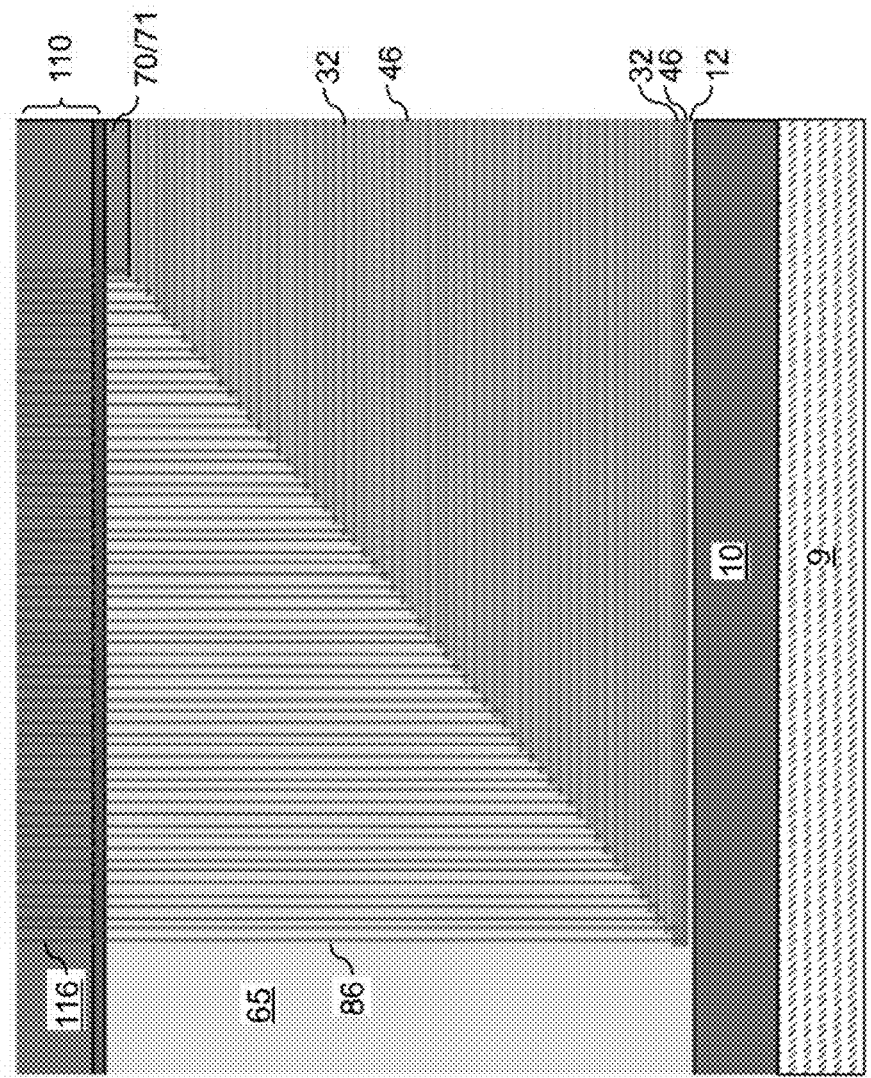
FIG. 12 is a vertical cross-sectional view of the exemplary structure along the plane Y-Y' of FIG. 11C after formation of word line contact via structures and metal lines according to an embodiment of the present disclosure.

Referring to FIG. 12, control gate contact via structures 86 can be formed through the retro-stepped dielectric material portion 65 to provide electrical contact to the electrically conductive layers 46, which function as the control gate electrodes for the memory elements in the memory stack structures 55. The vertical plane Y-Y' in FIG. 11C corresponds to the plane of the vertical cross-sectional view of FIG. 12. The control gate contact via structures 86 can be formed, for example, by forming control gate contact via cavities extending to end portions of the electrically conductive layers 46, and filling the control gate contact via cavities with at least one conductive material.

A first interconnect level dielectric layer 110 can be deposited over the contact level dielectric layer 71. The first interconnect level dielectric layer 110 includes a dielectric material such as silicon oxide, silicon nitride, and/or organosilicate glass. First level metal lines 116 can be formed in the first interconnect level dielectric layer 110 by forming line cavities in the first interconnect level dielectric layer 110 by a combination of lithographic methods and an anisotropic etch, and by filling the line cavities with at least one conductive material. Excess portions of the at least one conductive material can be removed from above the top surface of the first interconnect level dielectric layer 110 by a planarization process. Remaining portions of the at least one conductive material filling the line cavities constitute the first level metal lines 116. At least one of the first level metal lines 116 can contact, and/or be electrically shorted to, the control gate contact via structures 86. In an alternative embodiment, the first level metal lines 116 and the control gate contact via structures 86 may be formed in a single deposition step by filling vias and trenches extending through dielectrics 110 and 65.

Figure 13A:
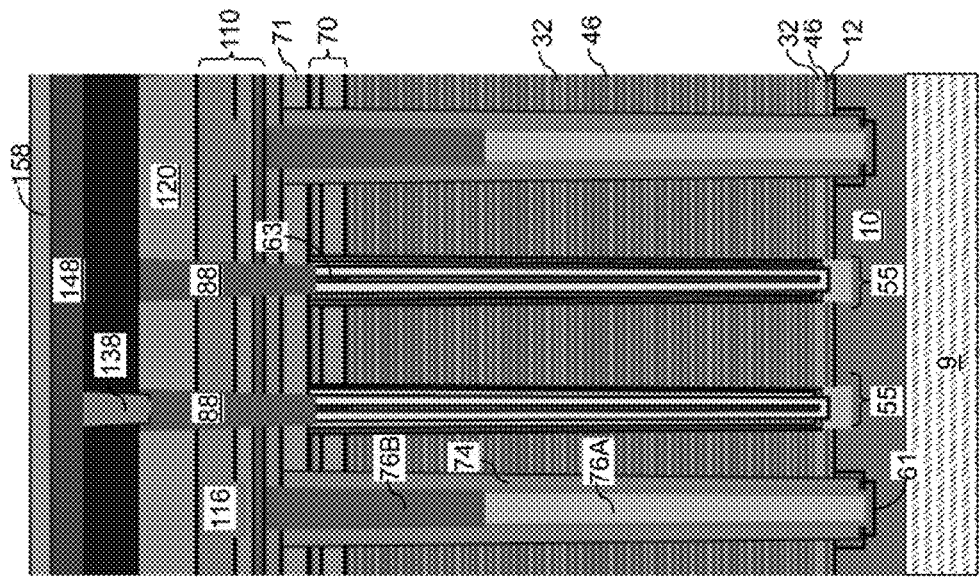
FIGS. 13A and 13B are vertical cross-sectional view of the exemplary structure after formation of first dielectric material layers, first contact via structures, and first metal lines according to an embodiment of the present disclosure.
Figure 13B:
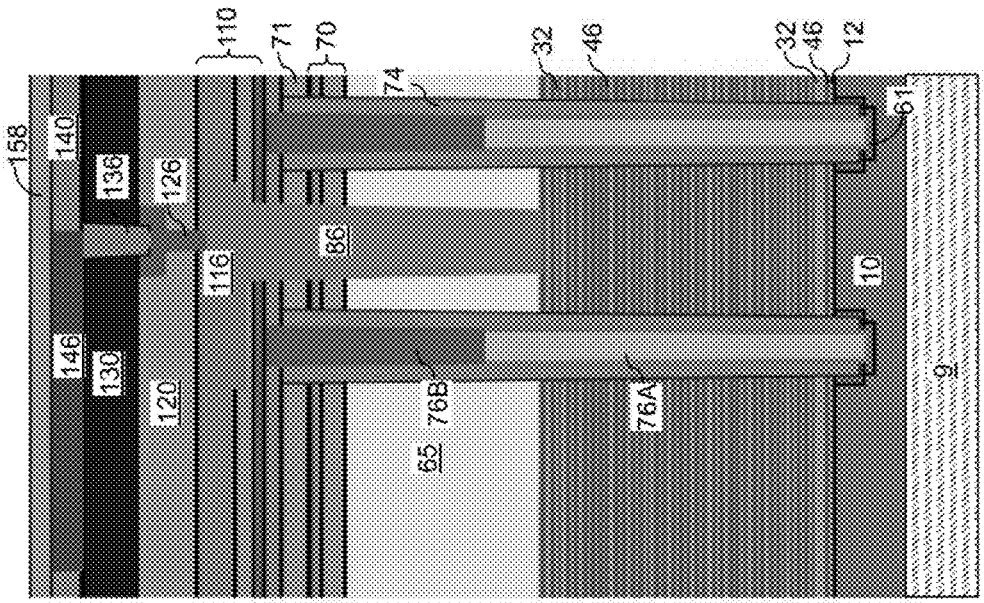

Referring to FIGS. 13A and 13B, a second interconnect level dielectric layer 120 can be formed over the first interconnect level dielectric layer 110. FIG. 13A is a vertical cross-sectional view along a plane corresponding to the vertical plane A-A' of FIG. 11C, and FIG. 13B is a vertical cross-sectional view along a plane corresponding to the vertical plane B-B' of FIG. 11C. The second interconnect level dielectric layer 120 includes a dielectric material such as silicon oxide, silicon nitride, and/or organosilicate glass. Conductive structures can be formed through the second interconnect level dielectric layer 120, which may include, for example, drain contact via structures 88 and integrated line and via structures 126. The drain contact via structures 88 can extend through the second interconnect level dielectric layer 120, the first interconnect level dielectric layer 110, and the contact via level dielectric layer 71 and contact the drain regions 63 that overlie memory stack structures 55. The integrated line and via structures 126 can extend through the second interconnect level dielectric layer 120 and can contact respective first level metal lines 116.

A third interconnect level dielectric layer 130 and a fourth interconnect level dielectric layer 140 can be formed over the second interconnect level dielectric layer 120. Each of the third interconnect level dielectric layer 130 and the fourth interconnect level dielectric layer 140 includes a dielectric material such as silicon oxide, silicon nitride, and/or organosilicate glass. Conductive structures can be formed through the third and fourth interconnect level dielectric layers (130, 140). The conductive structures can include interconnect metal via structures (136, 138) and second level metal lines (146, 148). In one embodiment, the interconnect metal via structures (136, 138) can include word line interconnect via structures 136 that are electrically shorted to respective electrically conductive layers 46 that include the control gate electrodes for the vertical memory device in the device region, and can include bit line interconnect via structures 138 that are electrically shorted to respective drain regions 63 of the vertical memory device in the device region. In one embodiment, the second level metal lines (146, 148) can include word line interconnects 146 that are electrically shorted to respective electrically conductive layers 46 through the word line interconnect via structures 136, and bit lines 148 that are electrically shorted to respective drain regions 63 through the bit line interconnect via structures 138 and the drain contact via structures 88.

Additional interconnect level dielectric layers (not shown) and additional via structures and metal lines (not shown) may be optionally formed to provide electrical wiring of the underlying electrically conductive components. Optionally, a dielectric cap layer 158 can be formed over the interconnect level dielectric layers (110, 120, 130, 140). The dielectric cap layer 158, if present, can include a passivation material such as silicon nitride.

The set of structures formed during the processing steps of FIGS. 12, 13A, and 13B collectively constitutes a metal interconnect structure, which is herein referred to as a first metal interconnect structure. The first metal interconnect structure includes first dielectric material layers (110, 120, 130, 140) overlying the alternating stack (32, 42), first metal lines (116, 146, 148) embedded within the first dielectric material layers (110, 120, 130, 140), and first contact via structures (136, 138, 86) contacting a bottom surface of a respective first metal line (116, 146, 148) and electrically shorted to a respective element selected from nodes of the memory stack structures (such as drain regions 63) and the electrically conductive layers 46. In one embodiment, the first metal lines (116, 146, 148) can include bit lines 148 electrically shorted to an end portion (e.g., to a drain region 63) of a respective semiconductor channel 60, and word line interconnects 146 electrically shorted to a respective electrically conductive layer 46 among the electrically conductive layers 46.

Figure 14A:
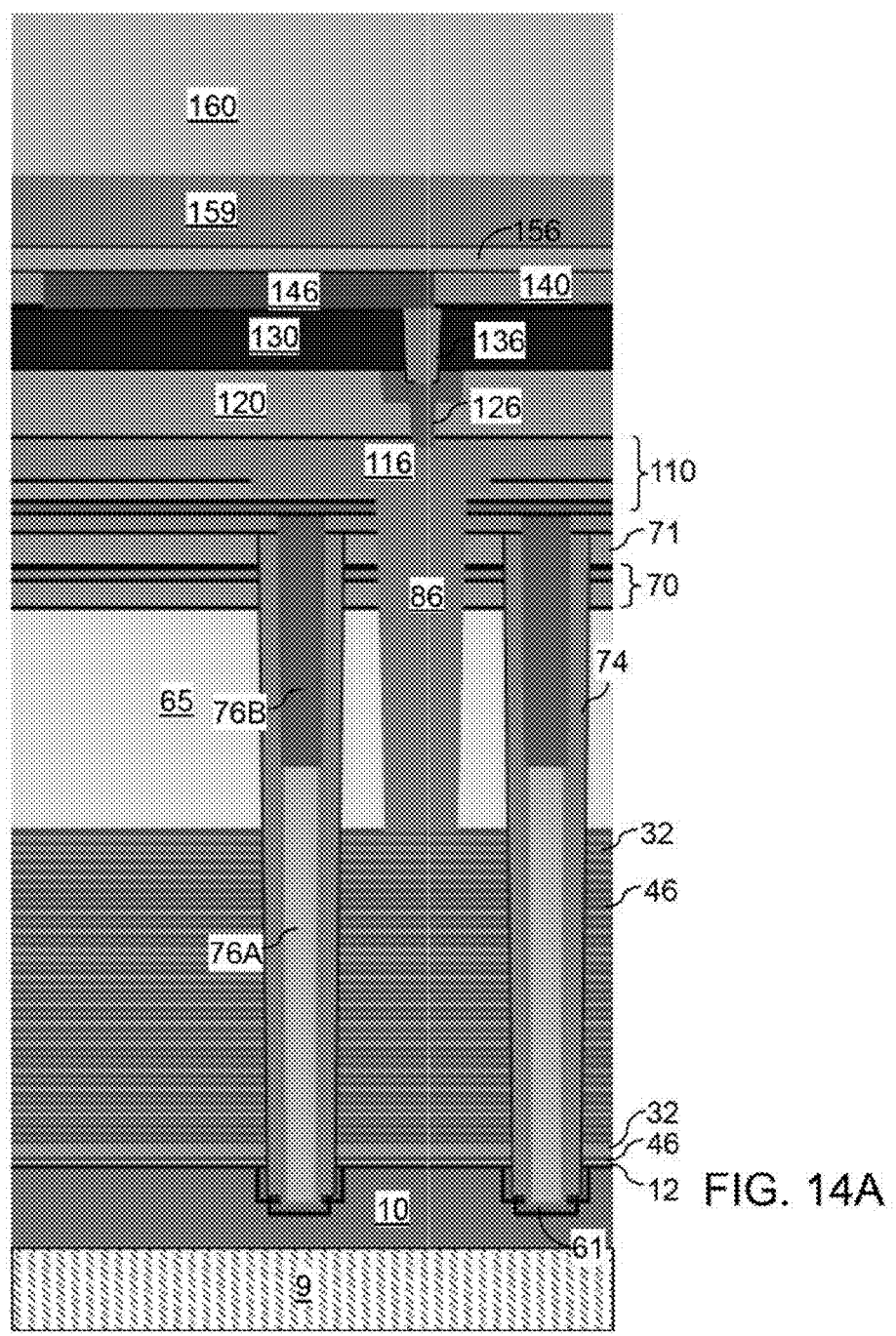
FIGS. 14A and 14B are vertical cross-sectional view of the exemplary structure after formation of a semiconductor material layer over the alternating stack and the first metal interconnect structure according to an embodiment of the present disclosure.
Figure 14B:
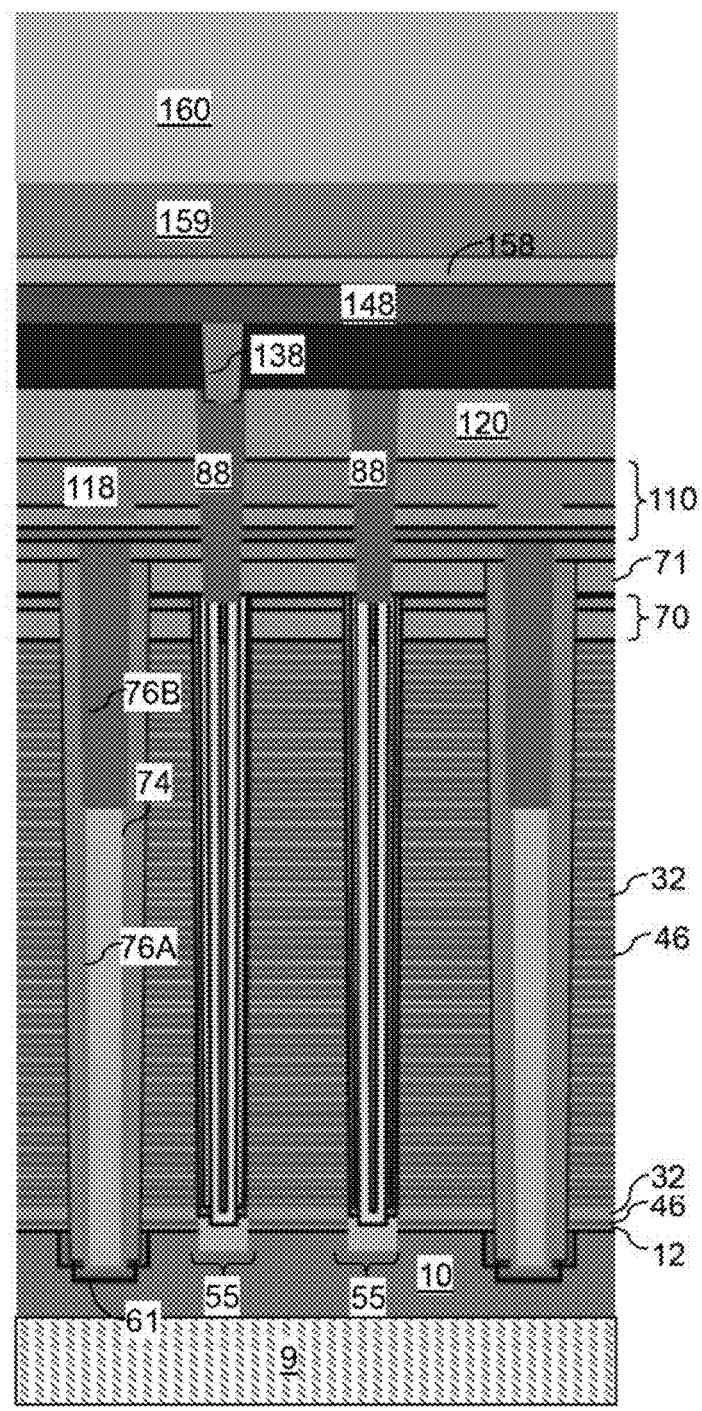

Referring to FIGS. 14A and 14B, a semiconductor material layer 160 is formed over the alternating stack (32, 46) and the first metal interconnect structure (110, 120, 130, 140, 116, 146, 148, 136, 138, 86). FIG. 14A is a vertical cross-sectional view along a plane corresponding to the vertical plane A-A' of FIG. 11C, and FIG. 14B is a vertical cross-sectional view along a plane corresponding to the vertical plane B-B' of FIG. 11C. In one embodiment, the semiconductor material layer 160 can be formed by bonding a single-crystalline semiconductor material substrate directly, or indirectly, to the first dielectric material layers (110, 120, 130, 140). In one embodiment, a bonding material layer 159 including a material that can bond to a semiconductor material can be formed over the first interconnect structure, and a semiconductor substrate including the semiconductor material layer 160 can be bonded to the bonding material layer 159. The bonding material layer 159 can include a dielectric material such as silicon oxide. The bonding material layer 159 can be formed, for example, by chemical vapor deposition. The thickness of the bonding material layer 159 can be in a range from 50 nm to 300 nm, although lesser and greater thicknesses can also be employed.

In one embodiment, the semiconductor material layer 160 can be a single crystalline semiconductor material layer such as a single crystalline silicon layer. The substrate including the semiconductor material layer 160 can consist of a single crystalline semiconductor material layer, or may include a handle substrate. The handle substrate, if present, can be removed after bonding the semiconductor material layer to the first dielectric material layers (110, 120, 130, 140). The semiconductor material layer 160 can have a thickness in a range from 50 microns to 1 mm as initially bonded to the first dielectric material layers (110, 120, 130, 140). Optionally, the thickness of the semiconductor material layer 160 may be reduced to a range from 5 microns to 100 microns, for example, by thinning or by cleaving. The thinning of the semiconductor material layer 160 may be performed by a dry etch process or a wet etch process, or may be performed by mechanical means (such as polishing or grinding). Specifically, direct bonding of hydrophilic silicon wafers can be applied to form silicon-on-insulator (SOI) structure shown in FIGS. 14A and 14B. Strong hydrophilic bonding of the bonding layer 150 with a silicon wafer 160 can be achieved at a low annealing temperature (e.g., less than 400° C.) by exposing the wafer 160 to a low pressure plasma prior to the bonding. The bonded wafer 160 may then be dry etched to thin it down to desirable thickness for CMOS.

In another embodiment, the semiconductor material layer 160 comprises a polycrystalline semiconductor material layer. In this case, the semiconductor material layer 160 can be formed by depositing a semiconductor material selected from a polycrystalline semiconductor material (such as polysilicon) and an amorphous semiconductor material (such as amorphous silicon) over the insulating layer 159, and optionally by annealing the deposited semiconductor material to increase its grain size. The anneal may comprise an excimer laser anneal. In one embodiment, the thickness of the semiconductor material layer 160 may be in a range from 100 nm to 10 microns, although lesser and greater thicknesses can also be employed.

Figure 15:
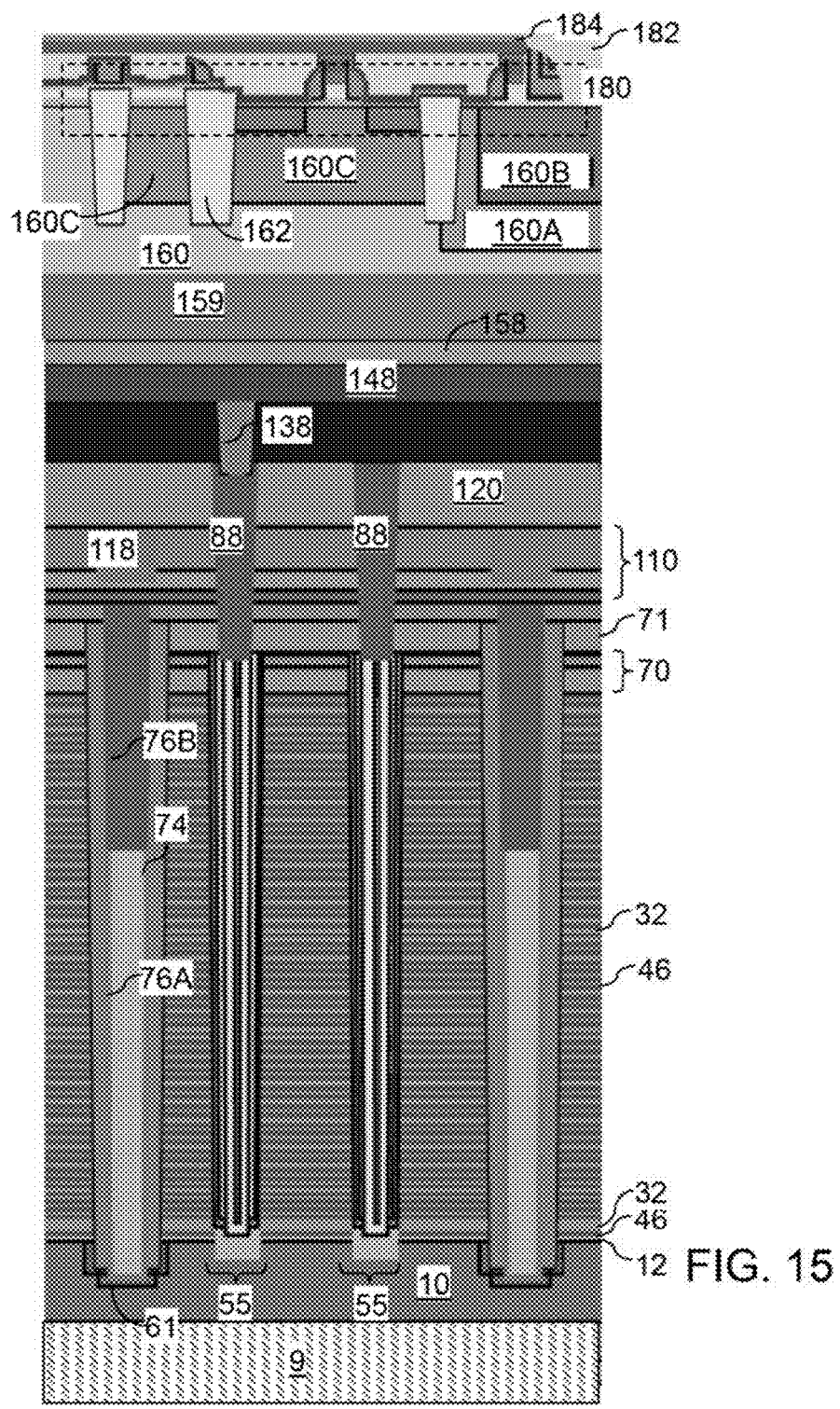
FIG. 15 is a vertical cross-sectional view of the exemplary structure after formation of semiconductor devices on the semiconductor material layer according to an embodiment of the present disclosure.

Referring to FIG. 15, various doped semiconductor wells (160A, 160B, 160C) can be formed within upper portions of the semiconductor material layer 160, for example, by implantation of electrical dopants, which can be p-type dopants or n-type dopants. Each of the doped semiconductor wells (160A, 160B, 160C) can be portions of the semiconductor material layer 160. Shallow trench isolation structures 162 including at least one dielectric material (such as silicon oxide, silicon nitride, or a combination thereof) can be formed to provide electrical isolation between various doped semiconductor wells (160A, 160B, 160C) that are present within the semiconductor material layer 160.

At least one semiconductor device 180 can be formed on or in the semiconductor material layer 60. In one embodiment, the at least one semiconductor device 180 can include one or more metal-oxide-semiconductor (MOS) field effect transistors that include a respective portion of a single crystalline semiconductor material layer as a channel. In another embodiment, the at least one semiconductor device 180 can include one or more metal-oxide-semiconductor (MOS) field effect transistors (i.e., thin film transistors, TFTs) that include a respective portion of the polycrystalline semiconductor material layer as a channel.

In one embodiment, the transistors comprise CMOS field effect transistor devices, such as TFT CMOS devices, and can include a device selected from a bit line driver for accessing bit lines for the memory stack structures 55, a word line driver for accessing control gate electrodes embodied as the electrically conductive layers 46, a source select gate driver for accessing a source node (i.e., a source region 61) for the memory stack structures 55, and a drain select gate driver for accessing a drain node (i.e., a drain region 63) for the memory stack structures 55. In general, the devices 180 may comprise word line or bit line driver circuit transistors, sense amplifier circuit devices, charge pump circuit devices, reference voltage and current circuit, and/or power-on circuit transistors and other devices, such as capacitors and/or diodes.

In one embodiment, at least one semiconductor device 180 can be formed within the same area as the array of the memory stack structures 55 in a plan view. As used herein, a plan view is a top-down view in which locations of elements are shown as if projected onto a horizontal plane irrespective to the height of the elements.

A planarization dielectric layer 182 can be formed over the at least one semiconductor device. The planarization dielectric layer 182 includes a dielectric material such as silicon oxide or organosilicate glass. The top surface of the at least one second dielectric material layer 182 can be planarized employing a planarization process such as chemical mechanical planarization. Optionally, a dielectric cap layer 184 can be formed over the planarization dielectric layer 182. The dielectric cap layer 184 can include a passivation material or an etch stop material such as silicon nitride.

Figure 16:
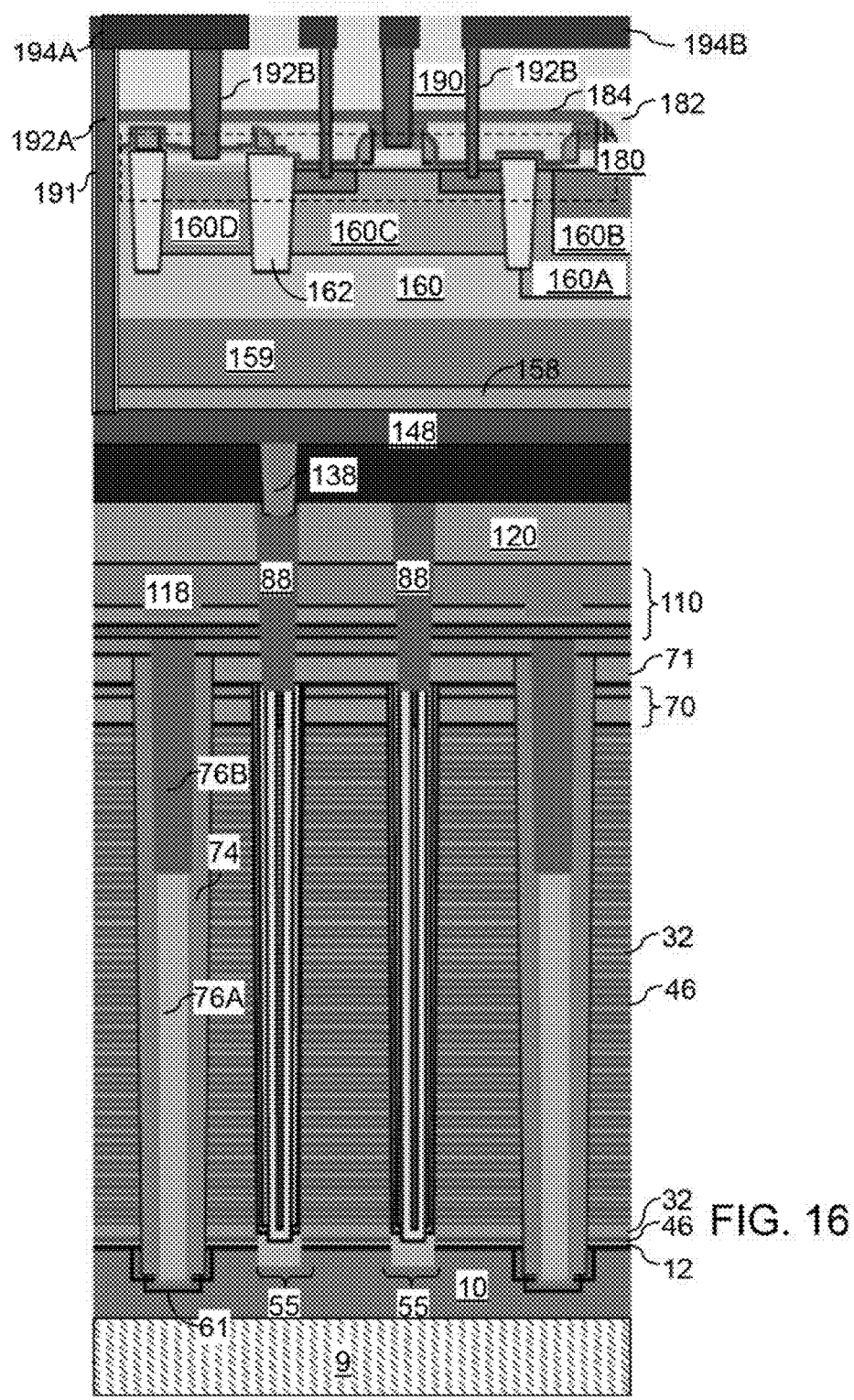
FIG. 16 is a vertical cross-sectional view of the exemplary structure after formation of a second metal interconnect structure according to an embodiment of the present disclosure.

Referring to FIG. 16, at least one second dielectric material layer 190 can be formed over the at least one semiconductor device 180. The at least one second dielectric material layer 190 includes a dielectric material such as silicon oxide, silicon nitride, and/or organosilicate glass. The thickness of the at least one second dielectric material layer 190 can be in a range from 100 nm to 500 nm, although lesser and greater thicknesses can also be employed.

Contact via structures (192A, 192B) can be formed through the at least one second dielectric material layer 190 to underlying electrical nodes of the second level metal lines (146, 148) and to various nodes of the at least one semiconductor device 180. The contact via structures (192A, 192B) can include second contact via structures 192A electrically shorted to respective first metal lines (116, 146, 148) (such as the second level metal lines (146, 148)) through the at least one second dielectric material layer 190, and third contact via structures 192B electrically shorted to a respective node (e.g., source, drain or gate) of the at least one semiconductor device 180 through the at least one second dielectric material layer 190.

In one embodiment, via cavities can be formed through the at least one second dielectric material layer 190 and the semiconductor material layer 160 to top surfaces of the first metal lines (116, 146, 148) employing a combination of lithographic methods and an anisotropic etch. Subsequent, an insulating spacer 191 can be formed at a periphery of each of the via cavities by deposition of a dielectric material layer, and an anisotropic etch that removes horizontal portions of the dielectric material layer. The second contact via structures 192A can be subsequently formed within the insulating spacers 191. Subsequently, second metal lines (194A, 194B) can be formed over, or within, the at least one second dielectric material layer 190 and on the second contact via structures 192A and on a subset of the third contact via structures 192B. In one embodiment, a first subset 194A of the second metal lines (194A, 194B) can be electrically shorted to the first metal lines (116, 146, 148), and a second subset 194B of the second metal lines (194A, 194B) may not be electrically shorted to the first metal lines (116, 146, 148), but may be instead electrically shorted to the contact via structures 192B. The first subset 194A of the second metal lines (194A, 194B) can electrically connect the at least one semiconductor device 180 to the first metal lines 148.

According to an aspect of the present disclosure, a three-dimensional semiconductor structure is provided, which comprises an alternating stack of insulating layers 32 and electrically conductive layers 46 located over a substrate (9, 10), and an array of memory stack structures 55 that extend through the alternating stack. Each of the memory stack structures comprises a plurality of memory elements surrounding a semiconductor channel 60. The three-dimensional semiconductor structure comprises a first metal interconnect structure overlying the alternating stack and comprising first dielectric material layers (110, 120, 130, 140), first metal lines (118, 146, 148) embedded within the first dielectric material layers (110, 120, 130, 140), and first contact via structures (86, 136, 138) contacting a bottom surface of a respective first metal line (118, 146, 148) and electrically shorted to a respective element selected from nodes (such as the drain regions 63 or the source regions 61) of the memory stack structures 55 and the electrically conductive layers 46, a semiconductor material layer 160 overlying the first metal interconnect structure, and at least one semiconductor device 180 located on or in the semiconductor material layer 160 and electrically connected to the first metal lines (118, 146, 148).

A second metal interconnect structure overlying the first metal interconnect structure can be provided. The second metal interconnect structure comprises at least one second dielectric material layer 190 that overlies the semiconductor material layer 160, second metal lines (194A, 194B) embedded within the at least one second dielectric material layer 190, second contact via structures 192A electrically shorted to a respective second metal line 194A and to a respective first metal line (118, 146, 148), and third contact via structures 192B electrically shorted to a respective second metal line 192A and to a respective node of the at least one semiconductor device 190.

In one embodiment, the substrate (9, 10) can comprise a substrate semiconductor layer 9. First semiconductor devices 210 can be formed on or in the substrate semiconductor layer 9, and second semiconductor devices 180 can be formed on or in the semiconductor material layer 160.

Within the exemplary structure, each of the memory stack structure 55 can comprise a tunneling dielectric 506 laterally surrounding a respective semiconductor channel 60, a vertical stack of charge storage regions (as embodied as portions of the memory material layer 504) laterally surrounding the tunneling dielectric layer 506, and a blocking dielectric (501, 503) disposed between the vertical stack of charge storage regions and the electrically conductive layers 46.

In one embodiment, the structure includes a three-dimensional memory device that comprises a vertical NAND device formed in a device region 100. The electrically conductive layers 46 comprise, or are electrically connected to, a respective word line of the NAND device. The device region 100 comprises a plurality of semiconductor channels 60. At least one end portion of each of the plurality of semiconductor channels 60 extends substantially perpendicular to a top surface of the substrate (9, 10). The structure includes a plurality of charge storage regions. Each charge storage region located adjacent to a respective one of the plurality of semiconductor channels 60. The structure includes a plurality of control gate electrodes (as embodied as end portions of the electrically conductive layers 46) having a strip shape extending substantially parallel to the top surface of the substrate (9, 10). The plurality of control gate electrodes comprises at least a first control gate electrode located in a first device level and a second control gate electrode located in a second device level. The electrically conductive layers 46 in the first alternating stack are in electrical contact with the plurality of control gate electrodes and extend from the device region 100 to a contact region 300 including a plurality of electrically conductive via connections (as embodied as word line contact via structures 86). In one embodiment, the substrate comprises a silicon substrate containing a driver circuit for the NAND device.

The number of word lines is expected to increase significantly in each new generation of vertical memory devices. Accordingly, the area needed for peripheral devices for memory stack structures is also expected to increase significantly in future vertical memory devices. The methods and devices of the present disclosure can be employed to shrink the die size and to increase array area efficiency by building peripheral CMOS devices for the peripheral circuitry (which includes drivers for the bit lines and word lines) on top of an array of memory stack structures 55. After formation of stepped surfaces and memory stack structures, the sacrificial material layers 42 are replaced with the electrically conductive layers 46. Bit lines and word lines can be subsequently formed. A semiconductor material layer 160 including a single crystalline semiconductor material or a polycrystalline semiconductor material layer is formed, and single crystalline channel field effect transistors or thin film transistors including polycrystalline channels can be formed. Contact via structures 192A providing electrical contacts to the various nodes of the array of memory stack structures 55 can be formed through the semiconductor material layer 160 that overlies the array of memory stack structures 55.

The methods of the present disclosure can solve CMOS thermal budget concerns for peripheral devices by making CMOS devices on the semiconductor material layer 160 after formation of the array of memory stack structures 55. Because the CMOS devices are formed over the area of the array of memory stack structures 55, the CMOS devices do not add to die size in any significant manner. The methods of the present disclosure do not increase metallization levels. Semiconductor processing cost can be further reduced through reduction of contact via depth in addition to die size reduction.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional semiconductor structure, comprising:
    an alternating stack of insulating layers and electrically conductive layers located over a substrate;
    an array of memory stack structures that extend through the alternating stack, each of the memory stack structures comprising a plurality of memory elements surrounding a semiconductor channel;
    a first metal interconnect structure overlying the alternating stack and comprising first dielectric material layers, first metal lines embedded within the first dielectric material layers, and first contact via structures contacting a bottom surface of a respective first metal line and electrically shorted to a respective element selected from nodes of the memory stack structures and the electrically conductive layers;
    a semiconductor material layer overlying the first metal interconnect structure; and
    at least one semiconductor device located on or in the semiconductor material layer and electrically connected to the first metal lines.

2. The three-dimensional semiconductor structure of claim 1, further comprising:
    a doped drain region located over an end portion of the semiconductor channel;
    a doped source region located in or on the substrate;
    a backside trench extending through the alternating stack; and
    a source contact via structure located the backside trench and contacting the doped source region.

3. The three-dimensional semiconductor structure of claim 2, wherein the at least one semiconductor device is located within a same area as the array of the memory stack structures in a plan view.

4. The three-dimensional semiconductor structure of claim 2, further comprising:
    a second metal interconnect structure overlying the first metal interconnect structure and comprising at least one second dielectric material layer that overlies the semiconductor material layer;
    second metal lines embedded within the at least one second dielectric material layer;
    second contact via structures electrically shorted to a respective second metal line and to a respective first metal line;
    third contact via structures electrically shorted to a respective second metal line and to a respective node of the at least one semiconductor device; and insulating spacers laterally surrounding a respective second contact via structure and electrically isolating the respective second contact via structure from the semiconductor material layer.

5. The three-dimensional semiconductor structure of claim 1, wherein the at least one semiconductor device comprises a metal-oxide-semiconductor (MOS) field effect transistor.

6. The three-dimensional semiconductor structure of claim 5, wherein:
the semiconductor structure comprises a vertical NAND memory device; and
the MOS field effect transistor is located in a CMOS device which comprises at least a portion of bit line driver for accessing bit lines for the memory stack structures, a word line driver for accessing control gate electrodes embodied as the electrically conductive layers, a source select gate driver for accessing a source node for the memory stack structures, or a drain select gate driver for accessing a drain node for the memory stack structures.

7. The three-dimensional semiconductor structure of claim 1, wherein the first metal lines comprise:
bit lines electrically shorted to an end portion of a respective semiconductor channel; and
word lines electrically shorted to a respective electrically conductive layer among the electrically conductive layers.

8. The three-dimensional semiconductor structure of claim 1, further comprising additional semiconductor devices located on or in a substrate semiconductor material layer within the substrate.

9. The three-dimensional semiconductor structure of claim 1, wherein:
the semiconductor material layer is a single-crystalline semiconductor material layer; and
the at least one semiconductor device comprises a metal-oxide-semiconductor (MOS) field effect transistor including a portion of the single-crystalline semiconductor material layer as a channel.

10. The three-dimensional semiconductor structure of claim 1, wherein:
the semiconductor material layer is a polycrystalline semiconductor material layer; and
the at least one semiconductor device comprises a metal-oxide-semiconductor (MOS) thin film transistor including a portion of the polycrystalline semiconductor material layer as a channel.

11. The three-dimensional semiconductor structure of claim 1, wherein each of the memory stack structure comprises:
a tunneling dielectric laterally surrounding a respective semiconductor channel;
a vertical stack of charge storage regions laterally surrounding the tunneling dielectric layer; and
a blocking dielectric disposed between the vertical stack of charge storage regions and the electrically conductive layers.

12. The three-dimensional semiconductor structure of claim 11, wherein:
the three-dimensional semiconductor structure comprises a vertical NAND device formed in a device region;
the electrically conductive layers comprise, or are electrically connected to, a respective word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the alternating stack are in electrical contact with the plurality of control gate electrodes and extend from the device region to a contact region including a plurality of electrically conductive via connections; and
the substrate comprises a silicon substrate.

13. A method of forming a three-dimensional semiconductor device, comprising:
forming an alternating stack of insulating layers and spacer material layers over a substrate;
forming an array of memory stack structures that extend through the alternating stack, each of the memory stack structures comprising a plurality of memory elements surrounding a semiconductor channel, wherein the spacer material layers are formed as, or are replaced with, electrically conductive layers;
forming a first metal interconnect structure, wherein the first metal interconnect structure comprises first dielectric material layers overlying the alternating stack, first metal lines embedded within the first dielectric material layers, and first contact via structures contacting a bottom surface of a respective first metal line and electrically shorted to a respective element selected from nodes of the memory stack structures and the electrically conductive layers;
forming a semiconductor material layer over the metal interconnect structure;
forming at least one semiconductor device on or in the semiconductor material layer; and
electrically connecting the at least one semiconductor device to the first metal lines.

14. The method of claim 13, further comprising:
forming a doped drain region over an end portion of the semiconductor channel;
forming backside trench extending through the alternating stack;
forming a doped source region in or on the substrate through the backside trench; and
forming a source contact via structure in the backside trench and contacting the doped source region.

15. The method of claim 13, wherein the at least one semiconductor device comprises a metal-oxide-semiconductor (MOS) field effect transistor.

16. The method of claim 15, wherein:
the semiconductor device comprises a vertical NAND memory device; and
the MOS field effect transistor is located in a CMOS device which comprises at least a portion of bit line driver for accessing bit lines for the memory stack structures, a word line driver for accessing control gate electrodes embodied as the electrically conductive layers, a source select gate driver for accessing a source node for the memory stack structures, or a drain select gate driver for accessing a drain node for the memory stack structures.

17. The method of claim 13, wherein the at least one semiconductor device is formed within a same area as the array of the memory stack structures in a plan view.

18. The method of claim 13, further comprising:
forming a second dielectric material layer that over the semiconductor material layer;
forming a second contact via structure electrically shorted to one of the first metal lines through the second dielectric material layer;
forming a third contact via structure electrically shorted to a node of the at least one semiconductor device through the second dielectric material layer;
forming a second metal line over, or within, second dielectric material layer and on the second contact via structure and third contact via structure;
forming a via cavity through the second dielectric material layer and the semiconductor material layer to top surfaces of one of the first metal lines;
forming an insulating spacer at a periphery of the via cavity; and
forming the second contact via structure within the insulating spacer.

19. The method of claim 13, wherein the first metal lines comprise:
bit lines electrically shorted to an end portion of a respective semiconductor channel; and
word lines electrically shorted to a respective electrically conductive layer among the electrically conductive layers.

20. The method of claim 13, wherein:
the substrate comprises a substrate semiconductor layer; and
the method comprises forming additional semiconductor devices on or in the substrate semiconductor layer.

21. The method of claim 13, wherein:
the semiconductor material layer is formed by bonding a single-crystalline semiconductor material layer to the first dielectric material layers; and
the at least one semiconductor device comprises a metal-oxide-semiconductor (MOS) thin film transistor including a portion of the single-crystalline semiconductor material layer as a channel.

22. The method of claim 13, wherein:
the semiconductor material layer comprises a polycrystalline semiconductor material layer; and
the at least one semiconductor device comprises a metal-oxide-semiconductor (MOS) field effect transistor including a portion of the polycrystalline semiconductor material layer as a channel.

23. The method of claim 22, wherein the polycrystalline semiconductor material layer is formed by depositing a semiconductor material selected from a polycrystalline semiconductor material and an amorphous semiconductor material, and by annealing the deposited semiconductor material to increase its grain size.

24. The method of claim 13, wherein each of the memory stack structure comprises:
a tunneling dielectric laterally surrounding a respective semiconductor channel;
a vertical stack of charge storage regions laterally surrounding the tunneling dielectric layer; and
a blocking dielectric disposed between the vertical stack of charge storage regions and the electrically conductive layers.

25. The method of claim 24, wherein:
the three-dimensional semiconductor structure comprises a vertical NAND device formed in a device region;
the electrically conductive layers comprise, or are electrically connected to, a respective word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the alternating stack are in electrical contact with the plurality of control gate electrodes and extend from the device region to a contact region including a plurality of electrically conductive via connections; and
the substrate comprises a silicon substrate.

26. A vertical NAND device, comprising:
a substrate;
a plurality of semiconductor channels, wherein at least one end portion of each of the plurality of semiconductor channels extends substantially perpendicular to a top surface of the substrate;
a plurality of doped drain regions located over the respective end portion of each of the plurality of semiconductor channels;
a doped source region located in or on the substrate;
a plurality of charge storage regions, each charge storage region located adjacent to a respective one of the plurality of semiconductor channels;
a plurality of control gate electrodes having a strip shape extending substantially parallel to the top surface of the substrate, wherein the plurality of control gate electrodes comprise at least a first control gate electrode located in a first device level and a second control gate electrode located in a second device level;
a lower select gate electrode located between the substrate and the plurality of control gate electrodes;
an upper select gate electrode located over a plurality of control gate electrodes;
a source contact via structure located in a trench extending through the plurality of control gate electrodes, the source contact via structure contacting the source region; and
driver circuit transistors located above the drain regions.

27. The vertical NAND device of claim 26, wherein the driver circuit transistors comprise thin film transistor CMOS devices.

28. The vertical NAND device of claim 26, wherein the driver circuit transistors comprise CMOS devices formed in a single crystal silicon layer bonded to a bonding layer located above the drain regions.

* * * * *